US012046071B2

United States Patent
Hsieh et al.

(10) Patent No.: US 12,046,071 B2
(45) Date of Patent: Jul. 23, 2024

(54) OPTICAL IMAGING DEVICE

(71) Applicant: VisEra Technologies Company Limited, Hsin-Chu (TW)

(72) Inventors: Chin-Chuan Hsieh, Hsin-Chu (TW); Wei-Ko Wang, Taoyuan (TW); Hsin-Wei Mao, Hsinchu (TW); Chung-Hao Lin, Keelung (TW)

(73) Assignee: VISERA TECHNOLOGIES COMPANY LIMITED, Hsin-Chu (TW)

(*) Notice: Subject to any disclaimer, the term of this patent is extended or adjusted under 35 U.S.C. 154(b) by 478 days.

(21) Appl. No.: 17/224,730

(22) Filed: Apr. 7, 2021

(65) Prior Publication Data

US 2021/0351216 A1    Nov. 11, 2021

Related U.S. Application Data

(60) Provisional application No. 63/022,077, filed on May 8, 2020.

(51) Int. Cl.
*G06V 40/13* (2022.01)
*G06V 10/147* (2022.01)
*H01L 27/146* (2006.01)

(52) U.S. Cl.
CPC ........ *G06V 40/1324* (2022.01); *G06V 10/147* (2022.01); *G06V 40/1318* (2022.01); *H01L 27/14621* (2013.01); *H01L 27/14623* (2013.01); *H01L 27/14627* (2013.01); *H01L 27/14636* (2013.01)

(58) Field of Classification Search
CPC ........ H01L 27/14623; H01L 27/14627; H01L 27/14636
See application file for complete search history.

(56) References Cited

U.S. PATENT DOCUMENTS

| 10,410,037 B2 | 9/2019 | He et al. | |
| 10,437,974 B2 | 10/2019 | He et al. | |
| 2021/0004558 A1* | 1/2021 | Zeng | H05K 1/189 |
| 2021/0011578 A1* | 1/2021 | Zhang | G06V 40/1324 |
| 2021/0151511 A1* | 5/2021 | Kim | G02B 5/005 |

(Continued)

FOREIGN PATENT DOCUMENTS

| CN | 110945524 A | * 3/2020 | ........... G06F 3/0412 |
| CN | 111095282 A | 5/2020 | |

(Continued)

OTHER PUBLICATIONS

Extended Search report (6 pages) mailed Oct. 21, 2021 in EP Application No. 21171921.6.

*Primary Examiner* — Thanh Luu
(74) *Attorney, Agent, or Firm* — MUNCY, GEISSLER, OLDS & LOWE, P.C.

(57) ABSTRACT

An aspect of the present invention provides an optical imaging device including a first detecting unit. The first detecting unit includes a plurality of first pixels, a first opaque layer and at least one first micro-lens. The plurality of first pixels respectively has a plurality of first optoelectronic elements. The first opaque layer has at least one opening and is disposed over the plurality of first optoelectronic elements. The at least one first micro-lens is disposed over the first opaque layer, and overlaps at least one of the plurality of first pixels.

20 Claims, 21 Drawing Sheets

(56) References Cited

U.S. PATENT DOCUMENTS

2021/0319207 A1* 10/2021 Zhong ................ G06V 40/1365
2021/0343771 A1* 11/2021 Iida ................... H01L 27/14623

FOREIGN PATENT DOCUMENTS

| CN | 111108510 A | 5/2020 |
| CN | 111108511 A | 5/2020 |
| JP | 2019122028 | 7/2019 |
| WO | WO2005/013369 | 2/2005 |

* cited by examiner

OPTICAL IMAGING DEVICE

CROSS REFERENCE TO RELATED APPLICATIONS

This application claims the benefit of U.S. Provisional Application No. 63/022,077, filed on May 8, 2020, the entirety of which is incorporated by reference herein.

BACKGROUND OF THE INVENTION

Field of the Invention

The present disclosure relates to an optical imaging device, and, in particular, to an optical imaging device providing reduced chip size and used in an optical fingerprint sensor.

Description of the Related Art

Biometric recognition has been very popular in recent years. A kind of biometric recognition system is an optical fingerprint sensor. A fingerprint recognition system has an optical fingerprint sensor that takes an image of the fingerprint of a user for the purpose of authenticating the user's identity, and decides whether or not to allow the user to access the device incorporating the fingerprint recognition system. Fingerprint recognition systems may be used for access control in mobile devices, such as cell phones, wearable electronic devices (e.g., smart watches), and tablet computers in a reliable, non-intrusive way.

Existing optical fingerprint sensors have a light source to illuminate a sensing area where a finger touches, and utilize an array of imaging detectors to receive the light reflected from the sensing area. The intensity of the light reflected by the ridges of the fingerprint is different than that reflected by the valleys. Thus, an array of imaging detectors can capture an accurate image the ridges and valleys and other features of a fingerprint.

A conventional optical fingerprint sensor provides a system with a large number of optical elements, such as beam splitters, collimators, focusing mirrors, and imaging detectors. Although such conventional optical fingerprint sensors have been generally adequate for their intended purposes, they have not been entirely satisfactory in all respects.

For example, each of the imaging detectors in a conventional optical fingerprint sensor receives light reflected from the sensing area directly above it through a corresponding collimator. As a result, the sensor active area which is provided by a chip in the conventional optical fingerprint sensor is typically identical to the area of the fingerprint being examined. The cost of sensor fabrication is dominated by the chip size. Consequently, it is desirable to provide a solution for a chip with an optical fingerprint sensor.

BRIEF SUMMARY OF THE INVENTION

An embodiment of the present invention provides an optical imaging device including a substrate, an opaque-layer stack and a plurality of detecting units. The opaque-layer stack includes a first opaque layer over the substrate and a second opaque layer over the first opaque layer. The plurality of detecting units are arranged in a matrix shown in a top view of a stack of the substrate and the opaque-layer stack. Each of the detecting units includes: a first optoelectronic element, a second optoelectronic element, a third optoelectronic element and a fourth optoelectronic element each disposed in the substrate and spaced apart from each other; four first openings in the first opaque layer, respectively exposing the first to fourth optoelectronic elements; and one second opening in the second opaque layer, configured to form a first optical channel connected to the first optoelectronic element, a second optical channel connected to the second optoelectronic element, a third optical channel connected to the third optoelectronic element and a fourth optical channel connected to the fourth optoelectronic element.

An embodiment of the present invention provides an optical imaging device including a first detecting unit. The first detecting unit includes a plurality of first pixels, a first opaque layer and at least one first micro-lens. The plurality of first pixels respectively have a plurality of first optoelectronic elements. The first opaque layer has at least one opening and is disposed over the plurality of first optoelectronic elements. The at least one first micro-lens is disposed over the first opaque layer. The at least one first micro-lens overlaps at least one of the plurality of first pixels.

An embodiment of the present invention provides an optical imaging device including a substrate, a first opaque layer with a plurality of first openings, and a micro-lens layer. The substrate includes a plurality of optoelectronic elements disposed therein and spaced apart from each other. The first opaque layer is disposed over the substrate. The plurality of first openings is spaced apart from each other. The micro-lens layer includes a plurality of micro-lenses over the first opaque layer. One of the plurality of optoelectronic elements, one of the plurality of first openings and one of the plurality of micro-lenses are arranged in a substantially straight line in a top view of a stack of the substrate, the first opaque layer and the micro-lens layer.

An embodiment of the present invention provides an optical imaging device including a substrate, an opaque-layer stack, a plurality of inner detecting units and a plurality of periphery detecting units. The opaque-layer stack includes a first opaque layer over the substrate, a second opaque layer over the first opaque layer and a third opaque layer over the second opaque layer. The plurality of inner detecting units are arranged in a matrix shown in a top view of a stack of the substrate and the opaque-layer stack. The plurality of periphery detecting units surround the matrix shown in the top view. Each of the inner and periphery detecting units includes: a first optoelectronic element, a second optoelectronic element, a third optoelectronic element and a fourth optoelectronic element, which are disposed in the substrate and spaced apart from each other, and the fourth optoelectronic element is farther away from the center of the matrix shown in the top view than the first optoelectronic element; at least one first opening in the first opaque layer, exposing at least the first optoelectronic element; at least one second opening in the second opaque layer; and one third opening embedded with a micro-lens in the third opaque layer. Each of the inner detecting units includes four first openings in the first opaque layer, respectively exposing the first to fourth optoelectronic elements. Each of the inner detecting units includes four second openings, spaced apart from each other, in the second opaque layer. Each of the periphery detecting units is configured to form a first optical channel connecting the micro-lens to the first optoelectronic element through the second opening. Each of the inner detecting units is configured to form a first optical channel extending from the micro-lens to the first optoelectronic element through the first of the second openings, a second optical channel extending from the micro-lens to the second optoelectronic element through the second of the second openings, a third optical channel extending from the micro-lens to the third optoelectronic element through the third of the second openings and a fourth optical channel extending from the micro-lens to the fourth optoelectronic element through the fourth of the second openings.

In addition, an embodiment of the present disclosure provides an optical imaging device including a substrate, an opaque-layer stack, a plurality of inner detecting units and a plurality of periphery detecting units. The opaque-layer stack includes a first opaque layer over the substrate, a second opaque layer over the first opaque layer and a third opaque layer over the second opaque layer. The plurality of inner detecting units are arranged in a matrix shown in a top view of a stack of the substrate and the opaque-layer stack. The plurality of periphery detecting units surrounds the matrix shown in the top view. Each of the inner and periphery detecting units includes: a first optoelectronic element, a second optoelectronic element, a third optoelectronic element and a fourth optoelectronic element, which are each disposed in the substrate and spaced apart from each other, and the fourth optoelectronic element is farther away from the center of the matrix shown in the top view than the first optoelectronic element, the third optoelectronic element is farther away from the center of the matrix shown in the top view than the second optoelectronic element; and one third opening embedded with a micro-lens in the third opaque layer. Each of the inner detecting units includes four first openings in the first opaque layer, respectively exposing the first to fourth optoelectronic elements. Each of the inner detecting units includes four second openings, spaced apart from each other, in the second opaque layer. Each of the inner detecting units is configured to form a first optical channel extending from the micro-lens to the first optoelectronic element through the first of the second openings, a second optical channel extending from the micro-lens to the second optoelectronic element through the second of the second openings, a third optical channel extending from the micro-lens to the third optoelectronic element through the third of the second openings and a fourth optical channel extending from the micro-lens to the fourth optoelectronic element through the fourth of the second openings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

Figure 1:
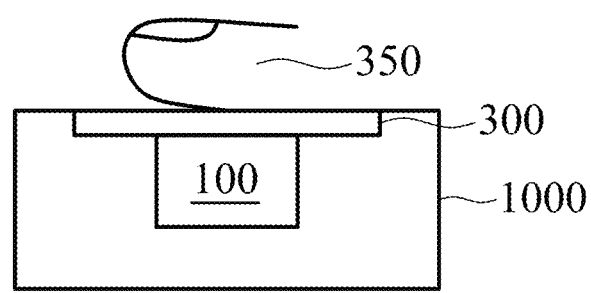
FIG. 1 shows a side view schematically illustrating an application of an embodiment of an optical imaging device to an optical fingerprint sensor, according to the present disclosure.

The following description is made for the purpose of illustrating the general principles of the disclosure and should not be taken in a limiting sense. The scope of the disclosure is best determined by reference to the appended claims.

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate direct contact of the first material layer and the second material layer, or it may indicate a non-contact state with one or more intermediate layers between the first material layer and the second material layer. In the above situation, the first material layer may not be in direct contact with the second material layer.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

In the subsequent description, phrases such as "a substantial geometric center", "substantially opposite directions", "substantially flat", "substantially the same" and etc . . . mean expected to be a geometric center, opposite directions, flat, the same and etc., as in practice, it is difficult to be mathematically or theoretically a geometric center, opposite directions, flat, the same and etc. due to limits of the practical manufacturing processes. Additionally, when deviation is in an acceptable range of a corresponding standard or specification, it is also recognized to be a geometric center, opposite directions, flat, the same and etc. Those skilled in the art are expected to acknowledge, that different standards or specifications, depend upon various properties and conditions, and thus, are not specifically listed.

FIG. 1 shows a side view schematically illustrating an application of an embodiment of an optical imaging device 100 to an optical fingerprint sensor, according to the present disclosure.

The optical fingerprint sensor includes an optical imaging device 100 and a cover substrate 300 over the optical imaging device 100. In some embodiments, the cover substrate 300 includes active light-emitting devices, such as organic light-emitting diodes (OLEDs), perovskite quantum dots or the like. The surface with fingerprint of the finger 350 is illuminated by light emitted from the active light-emitting devices, and reflects the light to the optical imaging device 100. The optical imaging device 100 receives and detects the light reflected by the ridge and the valley of the fingerprint of the finger 350, and then transfer the light signals into electrical signals, followed by formation of an image of the fingerprint of the finger 350. Embodiments of the optical imaging device 100 may provide an enlarged field of view (FOV), and therefore have a smaller sensor active area than the detection area of the fingerprint of the finger 350. In some embodiments, the optical fingerprint sensor comprising the optical imaging device 100 and the cover substrate 300 is used in an OLED display system 1000.

Figure 2A:
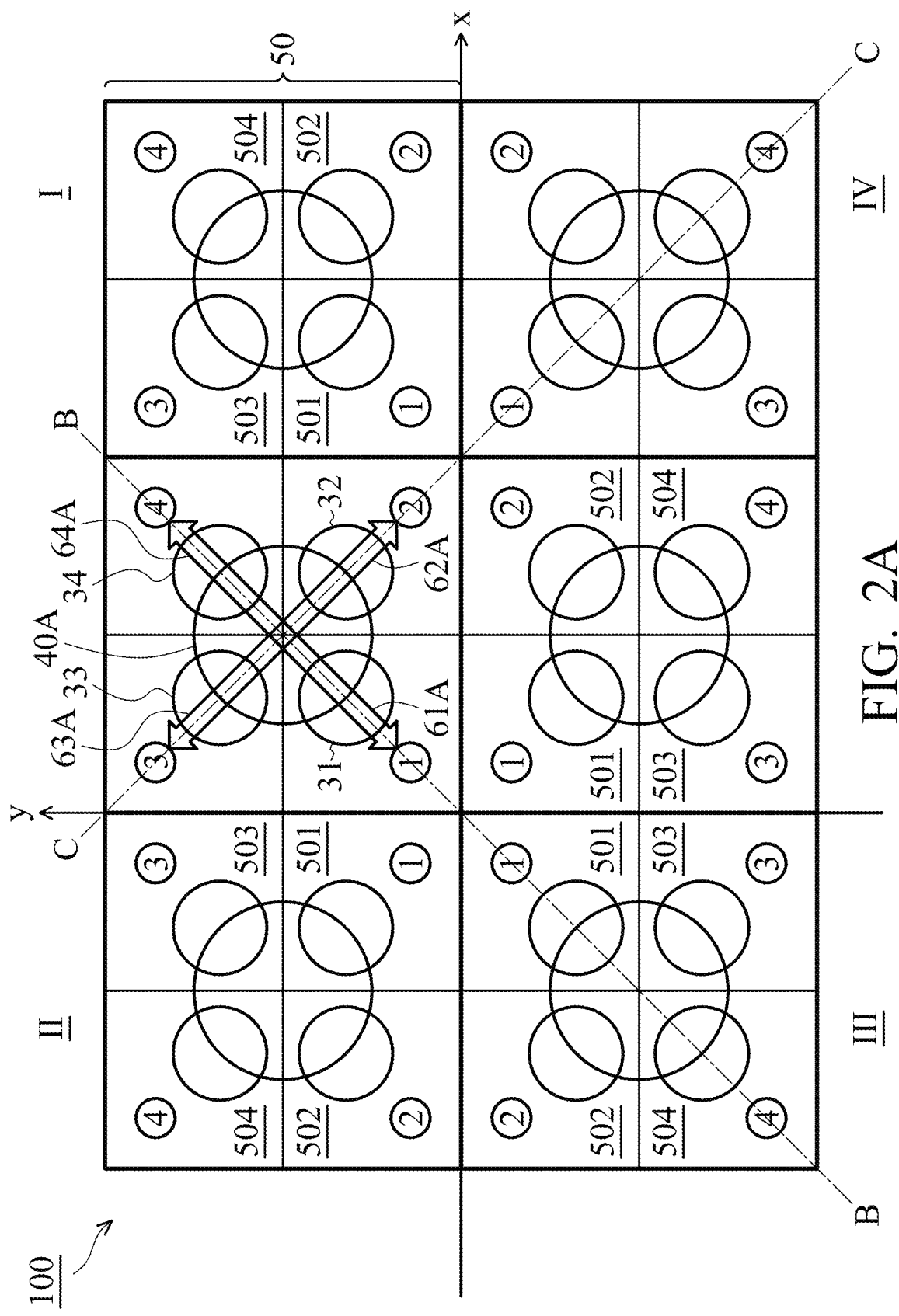
FIG. 2A shows a top view schematically illustrating an embodiment of an optical imaging device, according to the present disclosure.
Figure 2B:
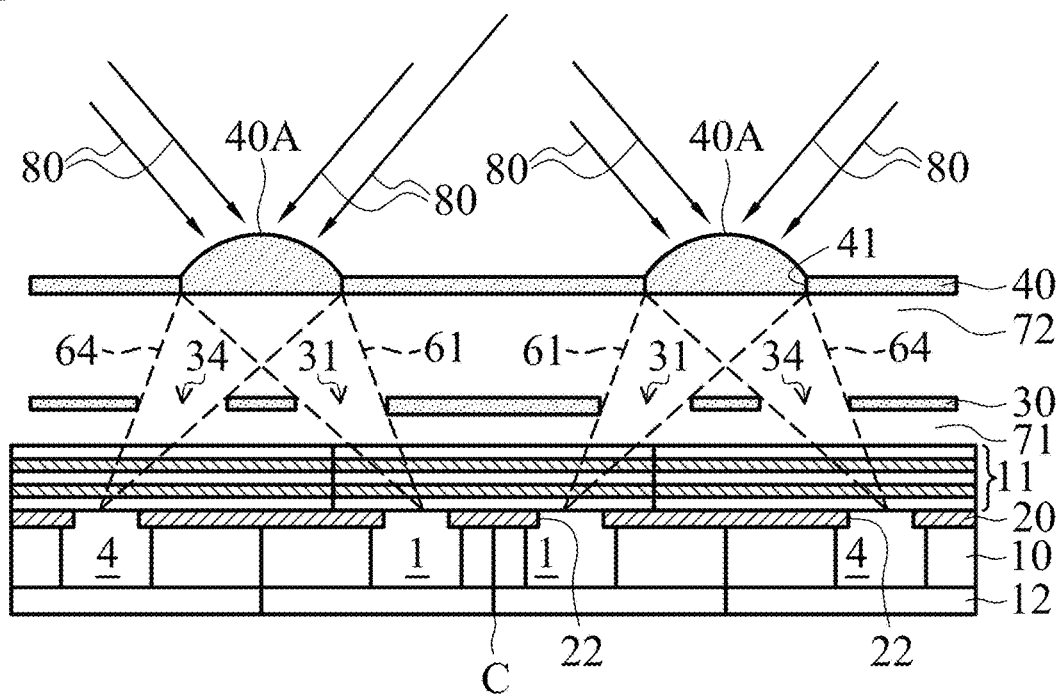
FIG. 2B shows a cross-sectional view along line B-B of FIG. 2A.
Figure 2C:
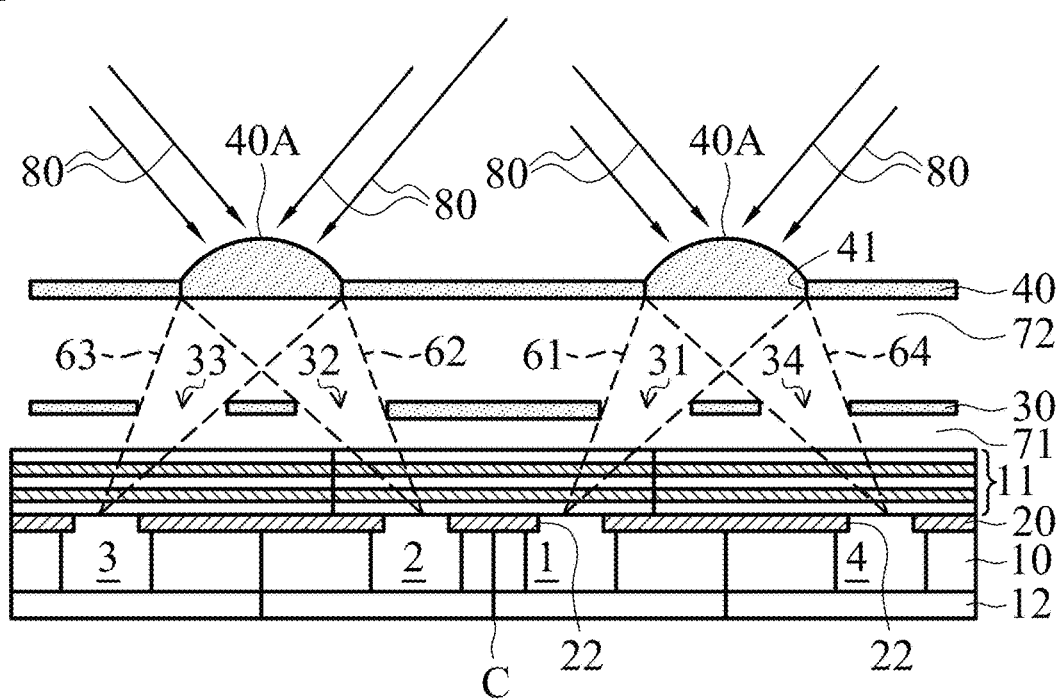
FIG. 2C shows a cross-sectional view along line C-C of FIG. 2A.

FIG. 2A shows a top view schematically illustrating an embodiment of the optical imaging device 100. The optical imaging device 100 includes a plurality of detecting units 50. In some embodiments, the plurality of detecting units 50 are arranged in a matrix as shown in FIG. 2A. In FIG. 2A, the detecting units 50 near and around the center C of the matrix are representatively shown. In some embodiments, the matrix of the detecting units 50 is rectangular as shown in FIG. 2A, and the detecting units 50 may be rectangular. In some alternative embodiments, the matrix of the detecting units 50 is polygonal, and the detecting units 50 may be polygonal. In some embodiments, the center C is a geometric center or a substantial geometric center of the matrix of the detecting units 50. In alternative embodiments, the center C is a desired reference point for the matrix of the detecting units 50, but is also named as "center" for the descriptions. FIG. 2B shows a cross-sectional view of the optical imaging device 100 along line B-B of FIG. 2A. FIG. 2C shows a cross-sectional view of the optical imaging device 100 along line C-C of FIG. 2A.

Referring to FIGS. 2A, 2B and 2C, the optical imaging device 100 includes a plurality of detecting units 50, and the plurality of detecting units 50 include a substrate 10 and an opaque-layer stack over the substrate 10. The opaque-layer stack includes an opaque layer 20 over the substrate 10 and an opaque layer 40 over the opaque layer 20.

The substrate 10 may include, but is not limited to, a semiconductor substrate such as a silicon substrate. In addition, the substrate 10 may include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 10 may include a semiconductor-on-insulator (SOI).

As shown in FIGS. 2A, 2B and 2C, in some embodiments, at least one of the detecting units 50 includes a plurality of pixels 501, 502, 503 and 504, an opaque layer 30 and a micro-lens 40A. The plurality of pixels 501, 502, 503 and 504 are respectively formed in the substrate 10. The plurality of pixels 501, 502, 503 and 504 respectively have a plurality of, such as first to fourth, optoelectronic elements 1, 2, 3 and 4. The opaque layer 30 has openings 31, 32, 33 and 34 and is disposed over the plurality of optoelectronic elements 1, 2, 3 and 4. The micro-lens 40A is disposed over the opaque layer 30. The micro-lens 40A overlaps at least one of the plurality of pixels 501, 502, 503 and 504. In the illustrated embodiment, the micro-lens 40A overlaps the plurality of pixels 501, 502, 503 and 504. In some embodiments, the plurality of optoelectronic elements 1, 2, 3 and 4, the openings 31, 32, 33 and 34 and the micro-lens 40A are configured to transmit light to the plurality of optoelectronic elements 1, 2, 3 and 4 from the micro-lens 40A.

As shown in FIGS. 2A, 2B and 2C, in some embodiments, each of the detecting units 50 includes a first optoelectronic element 1, a second optoelectronic element 2, a third optoelectronic element 3 and a fourth optoelectronic element 4 each disposed in the substrate 10 and spaced apart from each other. Each of the detecting units 50 further includes four openings 22 in the opaque layer 20 and one opening 41 in the opaque layer 40. The first optoelectronic element 1, the second optoelectronic element 2, the third optoelectronic element 3 and the fourth optoelectronic element 4 are exposed by the respective four openings 22 in each of the detecting units 50. The opening 41 is formed in the opaque layer 40 and configured to form a first optical channel 61 connected to the first optoelectronic element 1, a second optical channel 62 connected to the second optoelectronic element 2, a third optical channel 63 connected to the third optoelectronic element 3 and a fourth optical channel 64 connected to the fourth optoelectronic element 4.

Specifically, as shown in FIGS. 2B and 2C, the first optical channel 61 introduces light 80 from the opening 41 to the first optoelectronic element 1 exposed by a first of the four openings 22, such that the light 80 through the first optical channel 61 is received and detected by the first optoelectronic element 1. Similarly, the second optical channel 62 introduces light 80 from the opening 41 to the second optoelectronic element 2 exposed by a second of the four openings 22, such that the light 80 through the second optical channel 62 is received and detected by the second optoelectronic element 2. Similarly, the third optical channel 63 introduces light 80 from the opening 41 to the third optoelectronic element 3 exposed by a third of the four openings 22, such that the light 80 through the third optical channel 63 is received and detected by the third optoelectronic element 3. Similarly, the fourth optical channel 64 introduces light 80 from the opening 41 to the fourth optoelectronic element 4 exposed by a fourth of the four openings 22, such that the light 80 through the fourth optical channel 64 is received and detected by the fourth optoelectronic element 4. The light 80 is reflected by the ridge and the valley of the fingerprint of the finger 350 as shown in FIG. 1. When the incident light 80 of sufficient energy strikes the first optoelectronic element 1, the second optoelectronic element 2, the third optoelectronic element 3 and the fourth optoelectronic element 4, it generates an electron-hole pair that produces a photocurrent acting as electrical signals of the image of the fingerprint of the finger 350. The opening 41 is common to introduce light 80 to the first optoelectronic element 1, the second optoelectronic element 2, the third optoelectronic element 3 and the fourth optoelectronic element 4 in each of the detecting units 50, such that the first optoelectronic element 1, the second optoelectronic element 2, the third optoelectronic element 3 and the fourth optoelectronic element 4 receive inclined incident light. As a result, the optical imaging device 100 may have an enlarged FOV, and the dimension of a chip where the optical imaging device 100 is disposed can be decreased. When the optical fingerprint sensor comprising the optical imaging device 100 is used in the OLED display system 1000 as shown in FIG. 1, the optical imaging device 100 receiving inclined incident light contributes to collecting wide-angle fingerprint images. The details about the enlarged FOV of the optical imaging device 100 will be subsequently described.

In some embodiments, the opaque layer 20 is a metal layer patterned to form the four openings 22 therein. In alternative embodiments, the opaque layer 20 is made of a layer or layers of an opaque material or opaque materials other than metal. In some embodiments, the opaque layer 40 is made of a layer or layers of a polymer opaque material or polymer opaque materials patterned to form the opening 41 therein. In this embodiment, a metal layer acted as the opaque layer 20 is formed over the substrate 10, followed by performance of a patterning process on the metal layer to form the four openings 22 in the opaque layer 20, and then a photosensitive layer such as a layer of photoresist is formed over the patterned first opaque layer 20, followed by exposed to a light source to form the patterned second opaque layer 40 with the opening 41. The photoresist is either a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist.

In some embodiments, a layer of transparent material or layers of transparent materials (e.g. transparent to visible light), such as a transparent layer 71 and a transparent layer 72 as shown in FIGS. 2B and 2C are formed between the opaque layer 20 and the opaque layer 40 to adjust the incident angles of light incident to the first optoelectronic element 1, the second optoelectronic element 2, the third optoelectronic element 3 and the fourth optoelectronic element 4. Moreover, the incident angles of light incident to the first optoelectronic element 1, the second optoelectronic element 2, the third optoelectronic element 3 and the fourth optoelectronic element 4 may also be adjusted by shifting the respective distances from the first optoelectronic element 1, the second optoelectronic element 2, the third optoelectronic element 3 and the fourth optoelectronic element 4 to the opening 41 as shown in the top view in FIG. 2A. In some embodiments, the incident angles of light incident to the first optoelectronic element 1, the second optoelectronic element 2, the third optoelectronic element 3 and the fourth optoelectronic element 4 are respectively in a range from greater than zero degrees to 30 degrees. In some embodiments, the incident angles of light incident to the first optoelectronic element 1, the second optoelectronic element 2, the third optoelectronic element 3 and the fourth optoelectronic element 4 are respectively in a range from greater than zero degrees to 40 degrees.

As shown in FIGS. 2B and 2C, in some embodiments, the opaque-layer stack further includes an opaque layer 30 between the opaque layer 20 and the opaque layer 40, and each of the detecting units 50 further includes four openings 31, 32, 33 and 34, spaced apart from each other, in the opaque layer 30. In such embodiments, it is preferred that each of the detecting units 50 further includes one micro-lens 40A embedded in the opening 41. The micro-lens 40A has a substantially flat bottom surface and a curved upper surface that is convex to focus light 80 reflected by the ridge and the valley of the fingerprint of the finger 350 (shown in FIG. 1) and introduce the focused light to the first optoelectronic element 1, the second optoelectronic element 2, the third optoelectronic element 3 and the fourth optoelectronic element 4 through the respective openings 31, 32, 33 and 34, thereby increasing the light receiving efficiency of the optical imaging device 100. In such embodiments, the first optical channel 61 extends and introduces light 80 from the micro-lens 40A to the first optoelectronic element 1 through the third opening 31, the second optical channel 62 extends and introduces light 80 from the micro-lens 40A to the second optoelectronic element 2 through the third opening 32, the third optical channel 63 extends from the micro-lens 40A to the third optoelectronic element 3 through the third opening 33, and the fourth optical channel 64 extends from the micro-lens 40A to the fourth optoelectronic element 4 through the third opening 34.

In some embodiments, the opaque layer 30 is made of a layer or layers of a polymer opaque material or polymer opaque materials patterned to form the openings 31, 32, 33 and 34 therein. In one embodiment, the polymer opaque material or polymer opaque materials of the opaque layer 30 are substantially the same as that or those of the opaque layer 40. In an alternative embodiment, the polymer opaque material or polymer opaque materials of the opaque layer 30 are different from that or those of the opaque layer 40. In some embodiments, after the opaque layer 20 is formed and patterned to form the four openings 22 therein, a photosensitive layer such as a layer of photoresist is formed over the patterned first opaque layer 20, followed by exposed to a light source to form the patterned third opaque layer 30 with the openings 31, 32, 33 and 34, and then the opaque layer 40 are formed and patterned over the opaque layer 30 as described. Also, the photosensitive layer for the formation of the opaque layer 30 is either a negative photoresist or a positive photoresist as described for the photosensitive layer for the formation of the opaque layer 40.

In the embodiments where at least one of the transparent layer 71 and the transparent layer 72 as shown in FIGS. 2B and 2C are optionally formed, the transparent layer 71 can be optionally formed between the opaque layer 20 and the opaque layer 30, and/or the transparent layer 72 can be optionally formed between the opaque layer 30 and the opaque layer 40.

In some embodiments, in each of the detecting units 50, the micro-lens 40A may be formed by depositing a micro-lens material transparent to visible light in the opening 41 (e.g., by a spin-on method or a deposition process). A micro-lens template having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The micro-lens 40A is then formed by selectively etching the micro-lens material according to the micro-lens template.

In some embodiments, the first optoelectronic element 1, the second optoelectronic element 2, the third optoelectronic element 3 and the fourth optoelectronic element 4 in each of the detecting units 50 are CMOS (Complementary Metal-Oxide-Semiconductor) image sensors comprising photodiodes electrically connected to transistors electrically connected an interconnect structure 12. In some embodiment, the photodiodes are organic photodiodes.

The optical imaging device 100 can be front-side illuminated (FSI) or backside illuminated (BSI). When the optical imaging device 100 is FSI, an interconnect structure will be disposed over the opaque layer 20, and light 80 incident to the first optoelectronic element 1, the second optoelectronic element 2, the third optoelectronic element 3 and the fourth optoelectronic element 4 will be partially blocked and suffered more destructive interference by the interconnect structure. In the embodiment shown in FIGS. 2B and 2C, the optical imaging device 100 is BSI with the interconnect structure 12 disposed under the substrate 10, and therefore, light 80 directly illuminate the first optoelectronic element 1, the second optoelectronic element 2, the third optoelectronic element 3 and the fourth optoelectronic element 4 in each of the detecting units 50. As a result, the optical imaging device 100 is preferably BSI to provide a reduced destructive interference and better quantum efficiency. Moreover, the first optoelectronic element 1, the second optoelectronic element 2, the third optoelectronic element 3 and the fourth optoelectronic element 4 in each of the detecting units 50 of the optical imaging device 100 receive inclined incident light as described. When the optical imaging device 100 is BSI, the optical imaging device 100 may have more sensitivity to inclined incident light 80 than a FSI device.

In some embodiments, the interconnect structure 12 includes a plurality of metal interconnect layers formed within a dielectric structure formed under the substrate 10. In some embodiments, the plurality of metal interconnect layers may be formed by forming an inter-layer dielectric (ILD) layer under the substrate 10. The ILD layer is subsequently etched to form via holes and/or metal trenches. The via holes and/or metal trenches are then filled with a conductive material to form one or more of the plurality of metal interconnect layers. In some embodiments, the ILD layer may be deposited by a physical vapor deposition or chemical vapor deposition technique. The plurality of metal interconnect layers may be formed using a deposition process and/or a plating process (e.g., electroplating, electroless plating, etc.). In various embodiments, the plurality of metal interconnect layers may include tungsten, copper, or an aluminum-copper alloy, for example.

In some embodiments, the optical imaging device 100 further includes a multi-layered optical filter 11 disposed between the opaque layer 20 and the opaque layer 40. In embodiments where the opaque layer 30 is formed, the multi-layered optical filter 11 is disposed between the opaque layer 20 and the opaque layer 30. In embodiments where the transparent layer 71 is formed, the multi-layered optical filter 11 is disposed between the opaque layer 20 and the transparent layer 71. In some embodiments, the multi-layered optical filter 11 is an interference-type filter and may include dielectric material or inorganic material. The material may include $TiO_2$, $HfO_2$, $NbTiO_5$, $SiO_2$, other suitable materials or a combination thereof. The multi-layered optical filter 11 may be formed by a deposition process, an etching process, a lithography process, other suitable process or a combination thereof. The multi-layered optical filter 11 is provided to block light with a specific wavelength range. In this embodiment, the multi-layered optical filter 11 is provided to block infrared ray from entering the first optoelectronic element 1, the second optoelectronic element 2, the third optoelectronic element 3 and the fourth optoelectronic element 4 to increase the sensitivity to the fingerprint to be detected. The infrared ray may come from sun light, heat radiation from the finger 350 (shown in FIG. 1), etc.

In FIG. 2A showing a top view schematically illustrating an embodiment of the optical imaging device 100, Cartesian rectangular coordinate system is introduced in the drawing to assist to show the optical imaging device 100 and define some elements of the optical imaging device 100. Specifically, FIG. 2A shows a top view of a stack of the substrate 10 (shown in FIGS. 2B and 2C) and the opaque-layer stack of the opaque layer 20 (shown in FIGS. 2B and 2C), the opaque layer 40 (shown in FIGS. 2B and 2C) and the opaque layer 30 (shown in FIGS. 2B and 2C) if optionally formed. The plurality of detecting units 50 are arranged in a matrix which is rectangular as shown in FIG. 2A. Cartesian rectangular coordinate system provides x-axis and y-axis intersecting at the center C of the matrix of the detecting units 50 and can divide the arrangement of the detecting units 50 into regions of quadrant I, quadrant II, quadrant III and quadrant IV as shown in FIG. 2A.

Referring to FIG. 2A, as described, in each of the detecting units 50, the first optoelectronic element 1, the second optoelectronic element 2, the third optoelectronic element 3 and the fourth optoelectronic element 4 are each disposed in the substrate 10 and spaced apart from each other, and four openings 22 are disposed in the opaque layer 20, respectively exposing the first to fourth optoelectronic elements 1, 2, 3, 4. The embodiment exemplifies that four optoelectronic elements with some other elements of the same or corresponding quantity are provided in each of the detecting units 50 for illustrative purposes only and not intended to be limiting. Any suitable quantity of the optoelectronic elements depending on a desired requirement can be disposed in each of the detecting units 50. In some embodiments, each of the detecting units 50 is divided into a plurality of pixels, the quantity of the pixels is equal to or greater than the quantity of the optoelectronic elements in each of the detecting units 50, and the optoelectronic elements are respectively disposed in different pixels.

In FIG. 2A, in four optoelectronic elements of each of the detecting units 50, the closest to and the farthest from the center C of the matrix are respectively defined as the first optoelectronic element 1 and the fourth optoelectronic element 4. In the other two optoelectronic elements of each of the detecting units 50, the one closer to x-axis (and/or the one farther from y-axis) and the one closer to y-axis (and/or the one farther from x-axis) are respectively defined as the second optoelectronic element 2 and the third optoelectronic element 3. In some embodiments the distributions of the first optoelectronic element 1, the second optoelectronic element 2, the third optoelectronic element 3 and the fourth optoelectronic element 4 in regions of quadrant I, quadrant II, quadrant III and quadrant IV are symmetrical with each other relative to the x-axis, the y-axis, or the center C. In the embodiment illustrated in FIG. 2A, each of the detecting units 50 is divided into four pixels arranged in a 2×2 array with the first optoelectronic element 1, the second optoelectronic element 2, the third optoelectronic element 3 and the fourth optoelectronic element 4 respectively disposed in the four pixels. In each of the detecting units 50, the pixel where the first optoelectronic element 1 is disposed is pixel 501, the pixel where the second optoelectronic element 2 is disposed is pixel 502, the pixel where the third optoelectronic element 3 is disposed is pixel 503, and the pixel where the fourth optoelectronic element 4 is disposed is pixel 504.

In one representative detecting unit 50 in FIG. 2A, extending directions shown in the top view of the stack of the substrate 10 and the opaque-layer stack of the first optical channel 61, the second optical channel 62, the third optical channel 63 and the fourth optical channel 64 are represented by arrow marks. Specifically, in FIG. 2A, the first optical channel 61 and the fourth optical channel 64 extend in substantially opposite directions, and the second optical channel 62 and the third optical channel 63 extend in substantially opposite directions. It should be noted that the arrow marks merely show extending directions but do not represent the real profile of the optical channels. In alternative embodiments, extending directions 61A, 62A, 63A and 64A of the respective first optical channel 61, second optical channel 62, third optical channel 63 and fourth optical channel 64 can be properly distributed according to a desired requirement. In some embodiments, an angle between the extending direction 61A of the first optical channel 61 and a direction parallel to x-axis may be in a range from 0 degree to less than 80 degrees, and is approximately 45 degrees in the embodiment shown in FIG. 2A. In some embodiments, an angle between the extending direction 62A of the second optical channel 62 and a direction parallel to x-axis may be in a range from 0 degree to less than 80 degrees, and is approximately 45 degrees in the embodiment shown in FIG. 2A. In some embodiments, an angle between the extending direction 63A of the third optical channel 63 and a direction parallel to x-axis may be in a range from 0 degree to less than 80 degrees, and is approximately 45 degrees in the embodiment shown in FIG. 2A. In some embodiments, an angle between the extending direction 64A of the fourth optical channel 64 and a direction parallel to x-axis may be in a range from 0 degree to less than 80 degrees, and is approximately 45 degrees in the embodiment shown in FIG. 2A.

Figure 3A:
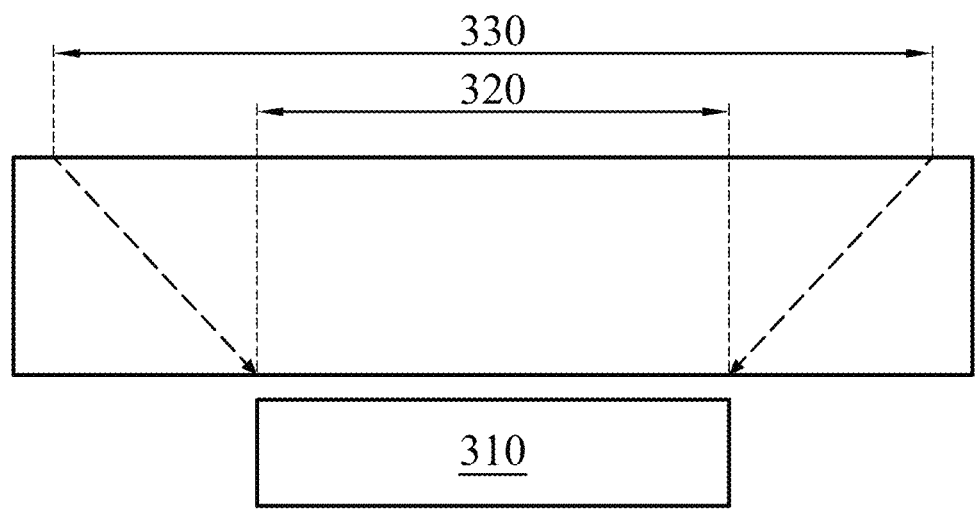
FIG. 3A schematically illustrates technical effects provided by an embodiment of an optical imaging device, according to the present disclosure.

FIG. 3A is a side view schematically illustrating enlargement of FOV provided by an embodiment of an optical imaging device, according to the present disclosure. The numeral "310" represents a sensor active area of the optical imaging device of the present disclosure. For example, the sensor active area 310 can be the footprint of the matrix of the detecting units shown in any of FIGS. 2A, 5A, 6A, 7, 8, 9A and 10A or their modifications in a chip. The FOV provided by a conventional optical fingerprint sensor having the same sensor active area as the sensor active area 310 is typically the FOV 320 having substantially the same area of that of the sensor active area of the conventional optical fingerprint sensor. As compared thereto, the FOV provided by the optical imaging device of the present disclosure is the FOV 330 apparently larger than the FOV 320.

Figure 3B:
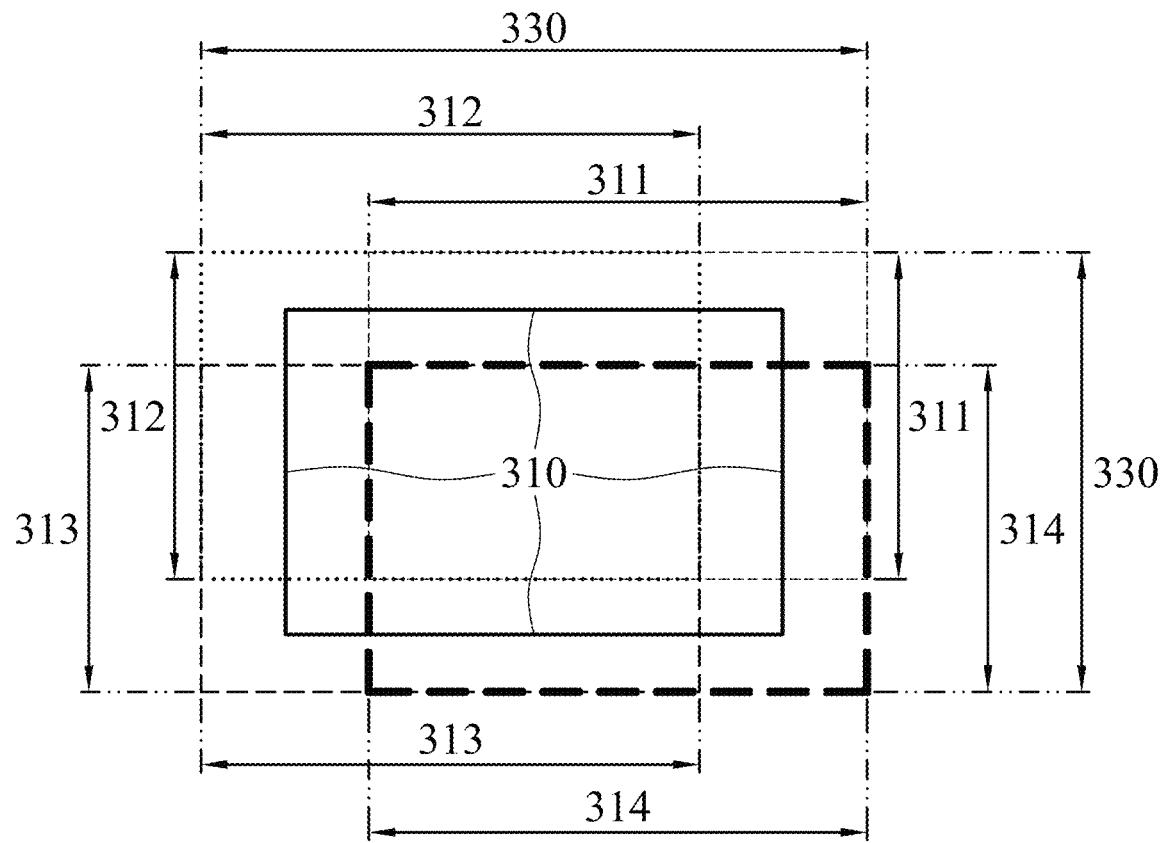
FIG. 3B schematically illustrates technical effects provided by an embodiment of an optical imaging device, according to the present disclosure.
Figure 4A:
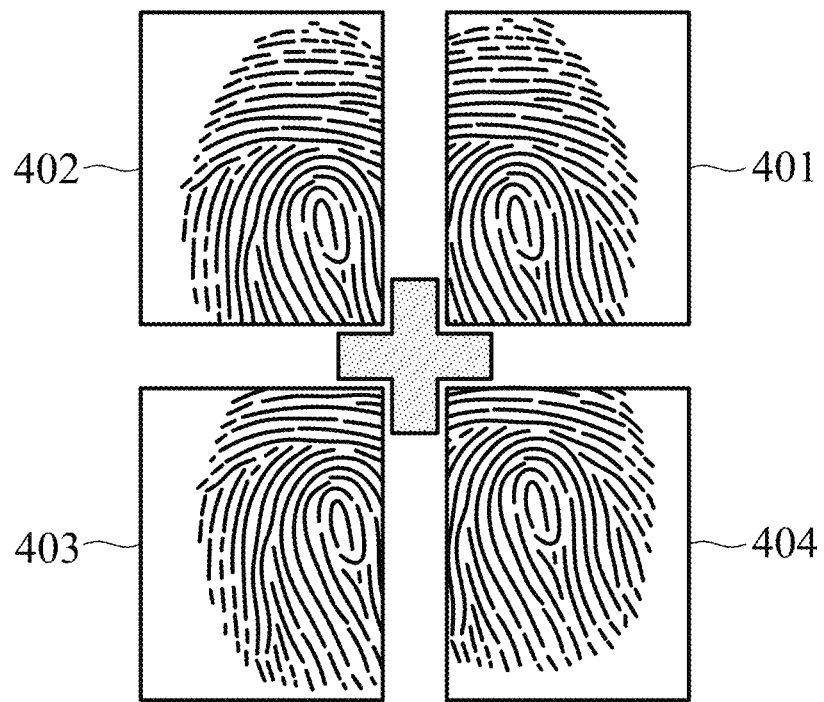
FIG. 4A schematically illustrates technical effects provided by an embodiment of an optical imaging device, according to the present disclosure.

FIG. 3B is a top view schematically shows how the FOV 330 enlarges. FIG. 4A schematically shows finger images formed by the optical imaging device of the present disclosure when the finger 350 is put on the cover substrate 300 as shown in FIG. 1. The optical imaging device 100 shown in FIGS. 2A through 2C will be used as an example to explain the mechanics to enlarge the FOV and to form the finger images. The other embodiments of the optical imaging devices of the present disclosure, such as the optical imaging devices shown in FIGS. 5A, 6A, 7, 8, 9A, and 10A or their modifications, may also provide the same or similar performance.

In FIG. 3B with reference to FIG. 2A, a sub-FOV 311 is a combination of FOVs of the first optoelectronic elements 1 (pixels 501) in quadrant I, the second optoelectronic elements 2 (pixels 502) in quadrant II, the fourth optoelectronic elements 4 (pixels 504) in quadrant III and the third optoelectronic elements 3 (pixels 503) in quadrant IV. The sub-FOV 311 and the sensor active area 310 have substantially the same area. The sub-FOV 311 shifts to the forward right of the sensor active area 310 as shown in FIG. 3B and is above the sensor active area 310. Similarly in FIG. 3B with reference to FIG. 2A, a sub-FOV 312 is a combination of FOVs of the second optoelectronic elements 2 (pixels 502) in quadrant I, the first optoelectronic elements 1 (pixels 501) in quadrant II, the third optoelectronic elements 3 (pixels 503) in quadrant III and the fourth optoelectronic elements 4 (pixels 504) in quadrant IV. The sub-FOV 312 and the sensor active area 310 have substantially the same area. The sub-FOV 312 shifts to the forward left of the sensor active area 310 as shown in FIG. 3B and is above the sensor active area 310. Similarly in FIG. 3B with reference to FIG. 2A, a sub-FOV 313 is a combination of FOVs of the fourth optoelectronic elements 4 (pixels 504) in quadrant I, the third optoelectronic elements 3 (pixels 503) in quadrant II, the first optoelectronic elements 1 (pixels 501) in quadrant III and the second optoelectronic elements 2 (pixels 502) in quadrant IV. The sub-FOV 313 and the sensor active area 310 have substantially the same area. The sub-FOV 313 shifts to the backward left of the sensor active area 310 as shown in FIG. 3B and is above the sensor active area 310. Similarly in FIG. 3B with reference to FIG. 2A, a sub-FOV 314 is a combination of FOVs of the third optoelectronic elements 3 (pixels 503) in quadrant I, the fourth optoelectronic elements 4 (pixels 504) in quadrant II, the second optoelectronic elements 2 (pixels 502) in quadrant III and the first optoelectronic elements 1 (pixels 501) in quadrant IV. The sub-FOV 314 and the sensor active area 310 have substantially the same area. The sub-FOV 314 shifts to the backward right of the sensor active area 310 as shown in FIG. 3B and is above the sensor active area 310. The complete FOV 330 of the optical imaging device of the present disclosure is a result of the combination of the sub-FOVs 311, 312, 313 and 314.

Figure 4B:
FIG. 4B schematically illustrates technical effects provided by an embodiment of an optical imaging device, according to the present disclosure.

In FIG. 4A with reference to FIG. 3B, an electronic device (e.g., the OLED display system 1000 shown in FIG. 1) having the optical imaging device 100 can access different fingerprint images. Specifically, the electronic device addresses the described pixels for the sub-FOV 311 to generate a fingerprint image 401, the described pixels for the sub-FOV 312 to generate a fingerprint image 402, the described pixels for the sub-FOV 313 to generate a fingerprint image 403 and the described pixels for the sub-FOV 314 to generate a fingerprint image 404. The electronic device may further find the common features from the fingerprint images 401, 402, 403 and 404 and fusion them together to integrate a complete fingerprint image 400 as shown in FIG. 4B. In some embodiments, the fingerprint images 401, 402, 403 and 404 are individually used by the electronic device. In some embodiments, the complete fingerprint image 400 is used by the electronic device.

Figure 5A:
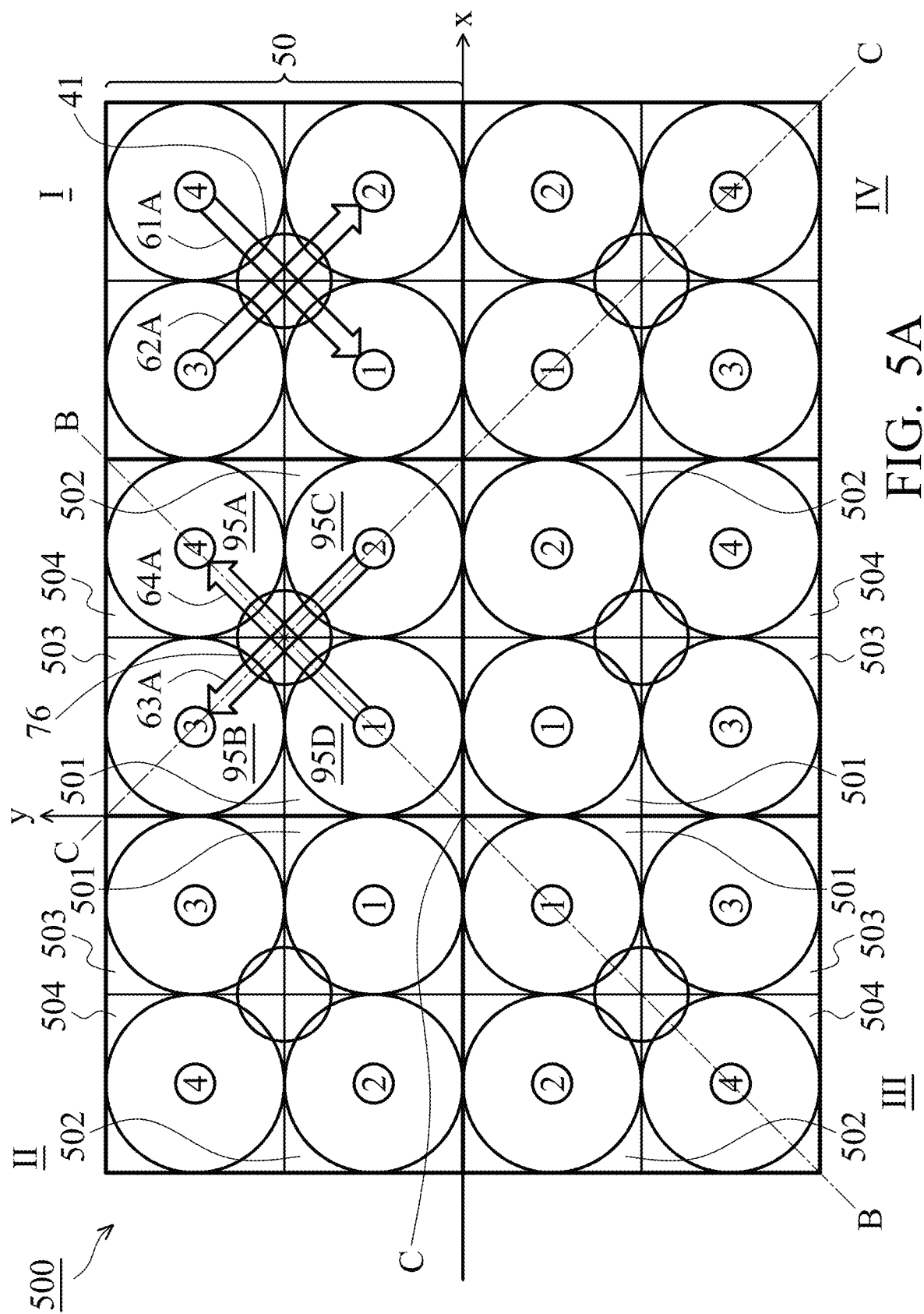
FIG. 5A shows a top view schematically illustrating some of the alternative embodiments of an optical imaging device, according to the present disclosure.
Figure 5B:
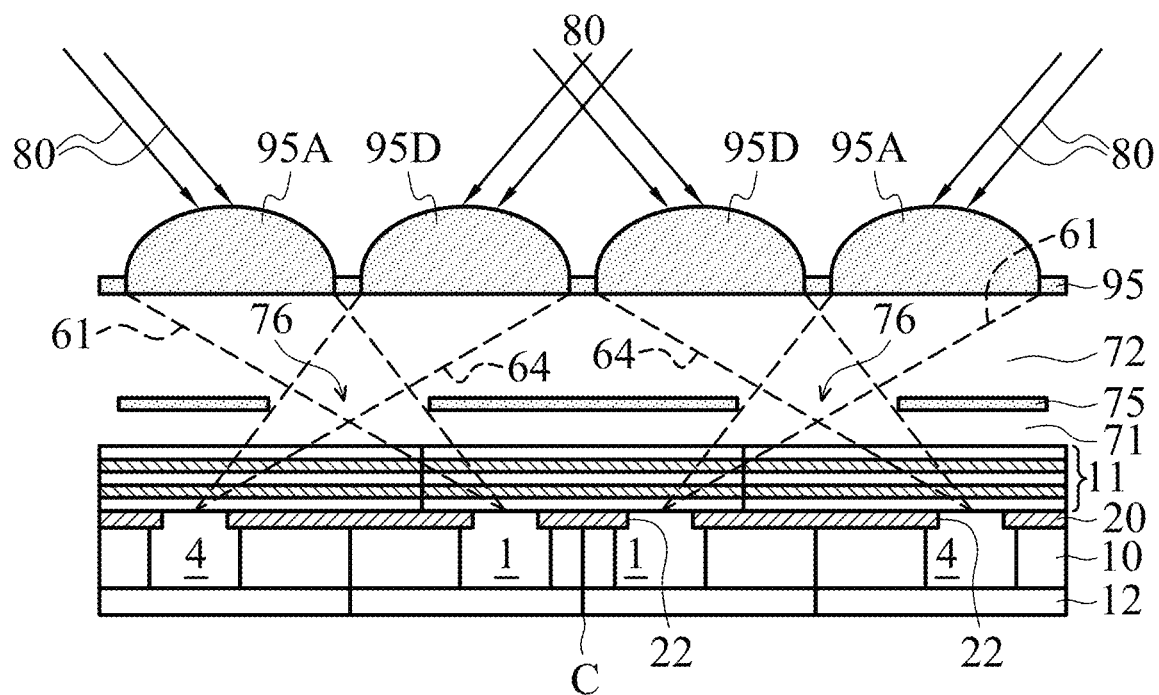
FIG. 5B shows a cross-sectional view along line B-B of FIG. 5A.
Figure 5C:
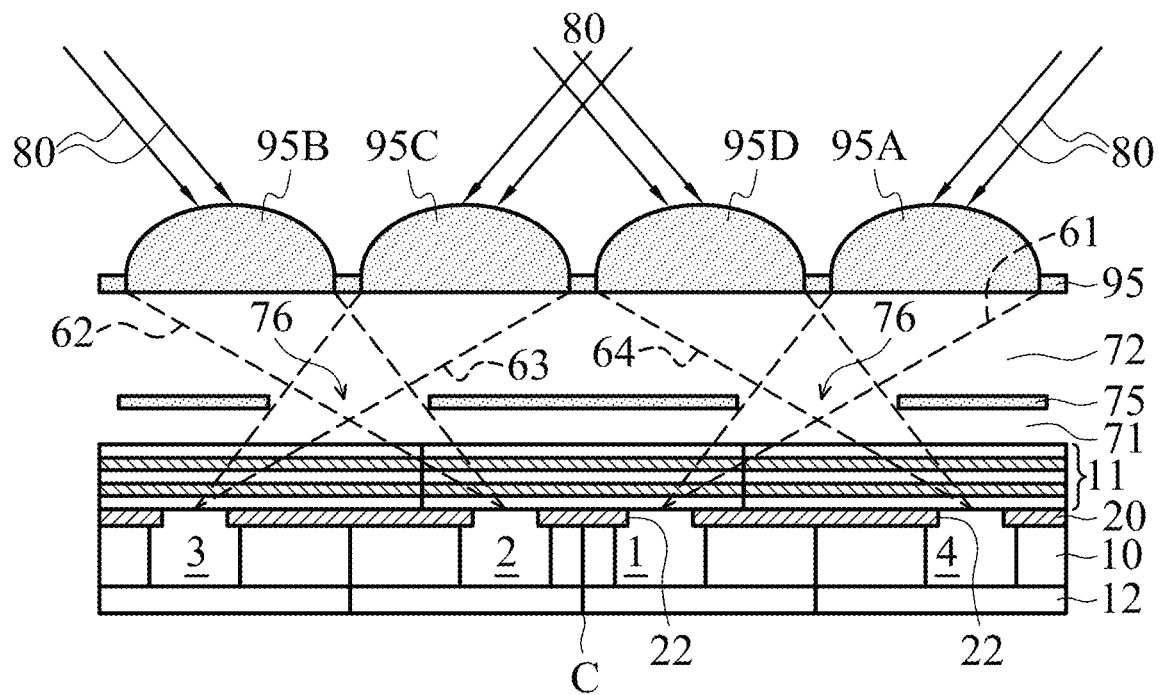
FIG. 5C shows a cross-sectional view along line C-C of FIG. 5A.

FIG. 5A shows a top view schematically illustrating an optical imaging device 500, according to some of the alternative embodiments of the present disclosure. The optical imaging device 500 includes a plurality of detecting units 50 arranged in a matrix as shown in FIG. 5A. In FIG. 5A, the detecting units 50 near and around the center C of the matrix are representatively shown. FIG. 5B shows a cross-sectional view of the optical imaging device 500 along line B-B of FIG. 5A. FIG. 5C shows a cross-sectional view of the optical imaging device 500 along line C-C of FIG. 5A.

The optical imaging device 500 shown in FIGS. 5A through 5C is different from the optical imaging device 100 shown in FIGS. 2A through 2C in configurations of micolenses and an opaque layer 95 over the opaque layer 75 instead of the opaque layer 30 between the opaque layer 20 and the opaque layer 40 of the optical imaging device 100. In this embodiment, the combinations of materials and process of the opaque layer 20 and the opaque layer 75 including the process to form the relating openings are similar to those of the opaque layer 20 and the opaque layer 40 of the optical imaging device 100. The detailed descriptions for elements or features of the optical imaging device 500 which are similar to those of the optical imaging device 100 shown in FIGS. 2A through 2C and are not substantially affected by the described differences from the optical imaging device 100 will be abbreviated hereinafter.

Referring to FIGS. 5A, 5B and 5C, in some embodiments, the optical imaging device 500 includes a plurality of detecting units 50, and the plurality of detecting units 50 include a substrate 10 and an opaque-layer stack over the substrate 10. The opaque-layer stack includes an opaque layer 20 over the substrate 10 and an opaque layer 75 over the opaque layer 20. The substrate 10 and the opaque layer 20 of the optical imaging device 500 and features formed or disposed in the substrate 10 and the opaque layer 20 are similar to those of the optical imaging device 100. Each of the detecting units 50 further includes four openings 22 in the opaque layer 20 and one opening 76 in the opaque layer 75, configured to form a first optical channel 61 connecting the common opening 76 to the first optoelectronic element 1, a second optical channel 62 connecting the common opening 76 to the second optoelectronic element 2, a third optical channel 63 connecting the common opening 76 to the third optoelectronic element 3 and a fourth optical channel 64 connecting the common opening 76 to the fourth optoelectronic element 4.

As shown in FIGS. 5A, 5B and 5C, in some embodiments, at least one of the detecting units 50 includes a plurality of pixels 501, 502, 503 and 504, an opaque layer 75 and a plurality of, such as first to fourth micro-lenses 95A, 95B, 95C and 95D. The plurality of pixels 501, 502, 503 and 504 are respectively formed in the substrate 10. The plurality of pixels 501, 502, 503 and 504 respectively have a plurality of, such as first to fourth, optoelectronic elements 1, 2, 3 and 4. The opaque layer 75 has an opening 76 and is disposed over the plurality of optoelectronic elements 1, 2, 3 and 4. In the illustrated embodiment, the opening 76 overlaps the plurality of pixels 501, 502, 503 and 504. The plurality of micro-lenses 95A, 95B, 95C and 95D are disposed over the opaque layer 75. The plurality of micro-lenses 95A, 95B, 95C and 95D respectively overlap at least one of the plurality of pixels 501, 502, 503 and 504. In the illustrated embodiment, the first micro-lens 95A overlaps the pixel 504, the first micro-lens 95B overlaps the pixel 503, the first micro-lens 95C overlaps the pixel 502 and the first micro-lens 95D overlaps the pixel 501. In some embodiments, the plurality of optoelectronic elements 1, 2, 3 and 4, the opening 76 and the plurality of micro-lenses 95A, 95B, 95C and 95D are configured to transmit light to the plurality of optoelectronic elements 1, 2, 3 and 4 through the opening 76.

Referring to FIGS. 5B and 5C, in some embodiments, the opaque-layer stack further includes an opaque layer 95 over the opaque layer 75, and each of the detecting units 50 further includes a first micro-lens 95A, a second micro-lens 95B, a third micro-lens 95C and a fourth micro-lens 95D each embedded in the opaque layer 95. The first micro-lens 95A, the second micro-lens 95B, the third micro-lens 95C and the fourth micro-lens 95D each has a substantially flat bottom surface and a curved upper surface that is convex to focus light 80 reflected by the ridge and the valley of the fingerprint of the finger 350 (with reference to FIG. 1 with replacing the optical imaging device 100 with the optical imaging device 500) and introduce the focused light to the first optoelectronic element 1, the second optoelectronic element 2, the third optoelectronic element 3 and the fourth optoelectronic element 4 through the common opening 76 in each of the detecting units 50, thereby increasing the light receiving efficiency of the optical imaging device 500. In such embodiments, the first optical channel 61 extends and introduces light 80 from the first micro-lens 95A to the first optoelectronic element 1 through the common opening 76, the second optical channel 62 extends and introduces light 80 from the second micro-lens 95B to the second optoelectronic element 2 through the common opening 76, the third optical channel 63 extends and introduces light 80 from the third micro-lens 95C to the third optoelectronic element 3 through the common opening 76, and the fourth optical channel 64 extends and introduces light 80 from the fourth micro-lens 95D to the fourth optoelectronic element 4 through the common opening 76.

In some embodiments, the opaque layer 95 is made of a layer or layers of a polymer opaque material or polymer opaque materials patterned to form the openings where the micolenses to be embedded in the opaque layer 95. In one embodiment, the polymer opaque material or polymer opaque materials of the opaque layer 95 are substantially the same as that or those of the opaque layer 75. In an alternative embodiment, the polymer opaque material or polymer opaque materials of the opaque layer 95 are different from that or those of the opaque layer 75. In some embodiments, after the opaque layer 75 is formed and patterned to form the common opening 76 therein, a photosensitive layer such as a layer of photoresist is formed over the patterned opaque layer 75, followed by exposed to a light source to form the patterned opaque layer 95 with the common opening 41 for embedding micro-lenses therein. Also, the photosensitive layer for the formation of the opaque layer 95 is either a negative photoresist or a positive photoresist as described for the photosensitive layer for the formation of the opaque layer 40 as shown in FIGS. 2B and 2C.

In the embodiments where at least one of the transparent layer 71 and the transparent layer 72 shown in FIGS. 5B and 5C and similar to those shown in FIGS. 2B and 2C are optionally formed, the transparent layer 71 can be optionally formed between the opaque layer 20 and second opaque layer 75, and/or the transparent layer 72 can be optionally formed between the opaque layer 95 and the opaque layer 75.

In some embodiments, in each of the detecting units 50, the first micro-lens 95A, the second micro-lens 95B, the third micro-lens 95C and the fourth micro-lens 95D may be formed by depositing a micro-lens material transparent to visible light in the openings (e.g., by a spin-on method or a deposition process) in the opaque layer 95. A micro-lens template having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The first micro-lens 95A, the second micro-lens 95B, the third micro-lens 95C and the fourth micro-lens 95D are then formed by selectively etching the micro-lens material according to the micro-lens template.

The optical imaging device 500 can be FSI or BSI. In the embodiment shown in FIGS. 5B and 5C, the optical imaging device 500 is BSI with the interconnect structure 12 similar to that of the optical imaging device 100 shown in FIGS. 2B and 2C disposed under the substrate 10, and the illustrated optical imaging device 500 is preferably BSI to provide a reduced destructive interference and better quantum efficiency. Moreover, the first optoelectronic element 1, the second optoelectronic element 2, the third optoelectronic element 3 and the fourth optoelectronic element 4 in each of the detecting units 50 of the optical imaging device 500 receive inclined incident light. When the optical imaging device 500 is BSI, the optical imaging device 500 may have more sensitivity to inclined incident light 80 than a FSI device.

In some embodiments, the optical imaging device 500 further includes a multi-layered optical filter 11 disposed between the opaque layer 20 and the opaque layer 75 as described for the optical imaging device 100 shown in FIGS. 2B and 2C.

In FIG. 5A showing a top view schematically illustrating an embodiment of the optical imaging device 500, Cartesian rectangular coordinate system is introduced in the drawing as in FIG. 2A. Similarly to the above descriptions for FIG. 2A, the embodiment shown in FIG. 5A exemplifies that four optoelectronic elements with some other elements of the same or corresponding quantity are provided in each of the detecting units 50 for illustrative purposes only and not intended to be limiting. Any suitable quantity of the optoelectronic elements depending on a desired requirement can be disposed in each of the detecting units 50. In some embodiments, each of the detecting units 50 is divided into a plurality of pixels, the quantity of the pixels is equal to or greater than the quantity of the optoelectronic elements in each of the detecting units 50, and the optoelectronic elements are respectively disposed in different pixels.

In the embodiment shown in FIG. 5A, four optoelectronic elements of each of the detecting units 50 are defined according to the same way as described for FIG. 2A, and each of the detecting units 50 is divided into four pixels arranged in a 2×2 array. In each of the detecting units 50, the pixel where the first optoelectronic element 1 is disposed is pixel 501, the pixel where the second optoelectronic element 2 is disposed is pixel 502, the pixel where the third optoelectronic element 3 is disposed is pixel 503, and the pixel where the fourth optoelectronic element 4 is disposed is pixel 504.

In two adjacent representative detecting units 50 in FIG. 5A, extending directions shown in the top view of the stack of the substrate 10 and the opaque-layer stack of the first optical channel 61, the second optical channel 62, the third optical channel 63 and the fourth optical channel 64 are represented by arrow marks. Specifically, in FIG. 5A, the first optical channel 61 and the fourth optical channel 64 extend in substantially opposite directions, and the second optical channel 62 and the third optical channel 63 extend in substantially opposite directions. It should be noted that the arrow marks merely show extending directions but do not represent the real profile of the optical channels. In alternative embodiments, extending directions 61A, 62A, 63A and 64A of the respective first optical channel 61, second optical channel 62, third optical channel 63 and fourth optical channel 64 can be properly distributed according to a desired requirement. In some embodiments, an angle between the extending direction 61A of the first optical channel 61 and a direction parallel to x-axis may be in a range from 0 degree to less than 80 degrees, and is approximately 45 degrees in the embodiment shown in FIG. 5A. In some embodiments, an angle between the extending direction 62A of the second optical channel 62 and a direction parallel to x-axis may be in a range from 0 degree to less than 80 degrees, and is approximately 45 degrees in the embodiment shown in FIG. 5A. In some embodiments, an angle between the extending direction 63A of the third optical channel 63 and a direction parallel to x-axis may be in a range from 0 degree to less than 80 degrees, and is approximately 45 degrees in the embodiment shown in FIG. 5A. In some embodiments, an angle between the extending direction 64A of the fourth optical channel 64 and a direction parallel to x-axis may be in a range from 0 degree to less than 80 degrees, and is approximately 45 degrees in the embodiment shown in FIG. 5A.

In some embodiments of the optical imaging device 100 of FIG. 2A, in each of the detecting units 50, one micro-lens is optionally disposed and common to introduce light to four optoelectronic elements. In some embodiments of the optical imaging device 500 of FIG. 5A, in each of the detecting units 50, four micro-lenses are optionally disposed to respectively introduce light to four optoelectronic elements. In the case shown in FIG. 2A, since there is only one micro-lens 40A provided within each of the detecting units 50, the diameter of the micro-lens 40A may be as great as possible without exceeding the detecting units 50 where it is. When the detecting units 50 in FIGS. 2A and 5A have the same size, the diameter of the micro-lens 40A may be greater than the diameters of any of the first micro-lens 95A, the second micro-lens 95B, the third micro-lens 95C and the fourth micro-lens 95D. The optical imaging device 100 shown in FIG. 2A have the micro-lenses 40A with greater diameters may provide more optical sensitivity than the optical imaging device 500 shown in FIG. 5A.

Figure 6A:
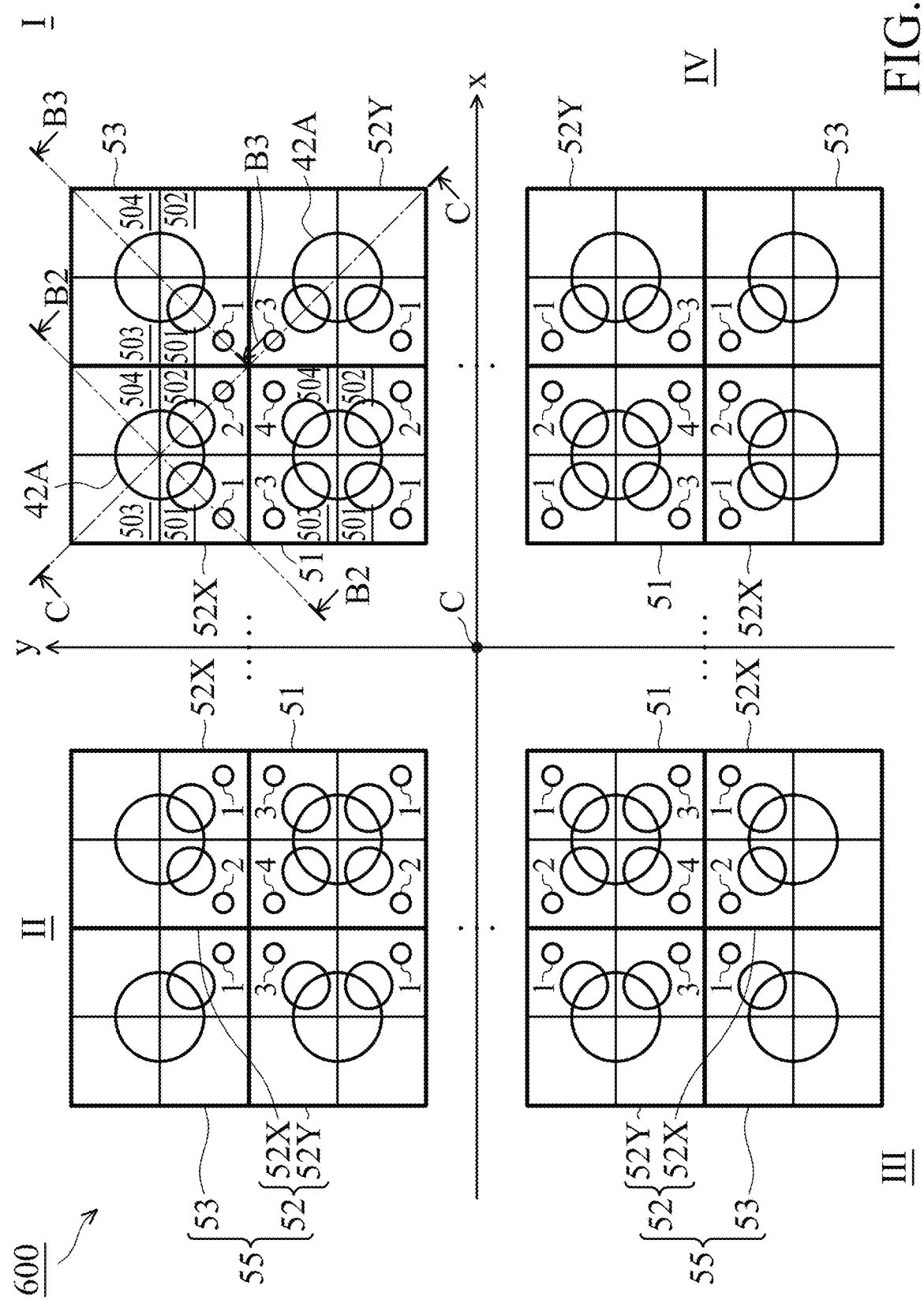
FIG. 6A shows a top view schematically illustrating some of the alternative embodiments of an optical imaging device, according to the present disclosure.
Figure 6B:
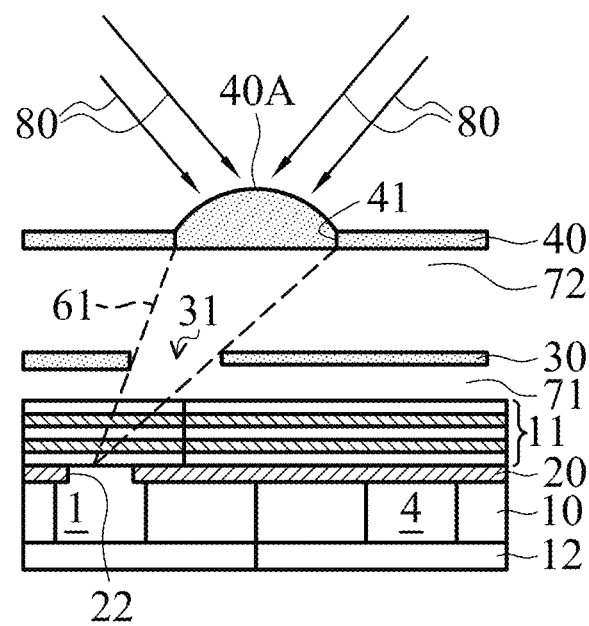
FIG. 6B shows a cross-sectional view along line B2-B2 and line B3-B3 of FIG. 6A.
Figure 6C:
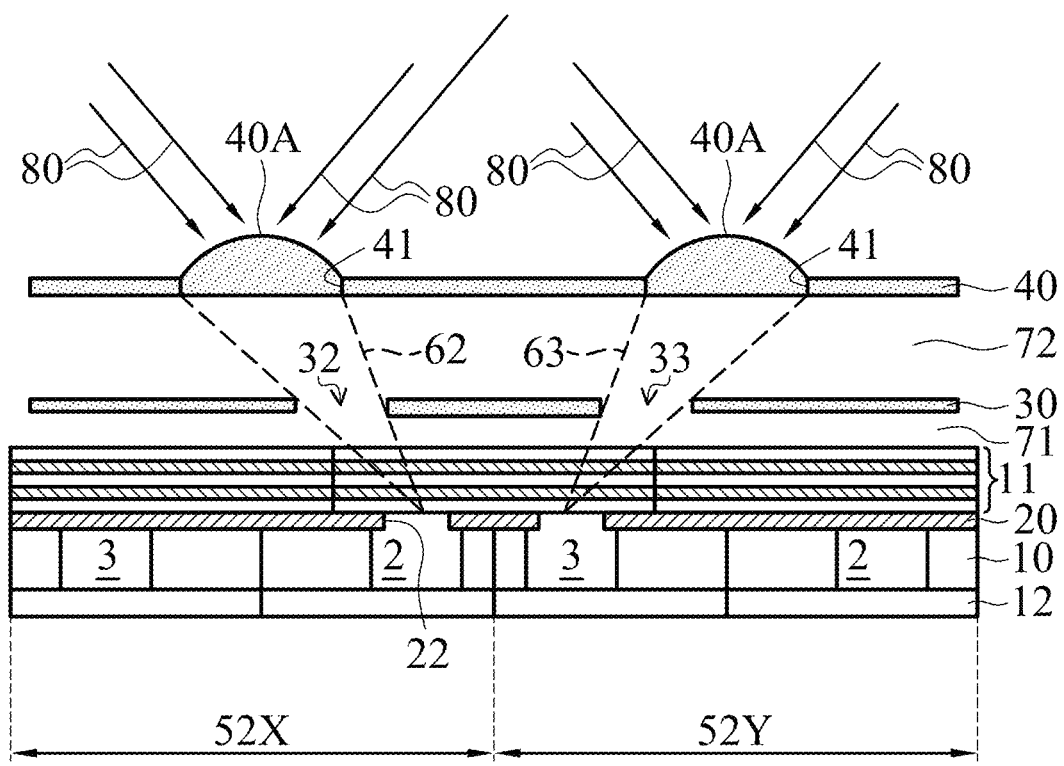
FIG. 6C shows a cross-sectional view along line C-C of FIG. 6A.

FIG. 6A shows a top view schematically illustrating an optical imaging device 600, according to some of the alternative embodiments of the present disclosure. The optical imaging device 600 includes a plurality of inner detecting units 51 arranged in a matrix and a plurality of periphery detecting units 55 surrounding the matrix as shown in FIG. 6A. In some embodiments, the plurality of periphery detecting units 55 are disposed in an edge portion of the optical imaging device 600. In FIG. 6A, the detecting units 51 and 55 near corners of the matrix are representatively shown. FIG. 6B shows a cross-sectional view of the optical imaging device 600 along line B2-B2 and line B3-B3 of FIG. 6A. FIG. 6C shows a cross-sectional view of the optical imaging device 600 along line C-C of FIG. 6A. Also, the Cartesian rectangular coordinate system provides an x-axis and a y-axis intersecting at the center C of the matrix of the inner detecting units 51 and can divide the arrangement of the detecting units 51 and 55 into regions of quadrant I, quadrant II, quadrant III and quadrant IV as shown in FIG. 6A. In some embodiments, the center C is a geometric center or a substantial geometric center of the matrix of the inner detecting units 51. In alternative embodiments, the center C is a desired reference point for the matrix of the inner detecting units 51, but is also named as "center" for the descriptions.

Comparing the optical imaging device 600 shown in FIG. 6A with the optical imaging device 100 shown in FIG. 2A, elements or features of each of the inner detecting units 51 and the matrix of the inner detecting units 51 of the optical imaging device 600 are similar to or the same with elements or features of each of the detecting units 50 and the matrix of the detecting units 50 of the optical imaging device 100 as shown in FIGS. 2A through 2C. The optical imaging device 600 shown in FIG. 6A further includes the plurality of periphery detecting units 55 surrounding the matrix of the detecting units 51. FIGS. 6B and 6C illustrate the cross-sectional structures of the periphery detecting units 55.

In FIGS. 6A, 6B and 6C with reference to FIGS. 2B and 2C, the optical imaging device 600 includes a plurality of inner detecting units 51 and a plurality of periphery detecting units 55, and the plurality of inner detecting units 51 and the plurality of periphery detecting units 55 include a substrate 10 and an opaque-layer stack over the substrate 10. The opaque-layer stack includes an opaque layer 20 over the substrate 10 and an opaque layer 40 over the opaque layer 20. The opaque-layer stack further includes an opaque layer 30 between the opaque layer 20 and the opaque layer 40. In each of the inner detecting units 51, the details about the first optoelectronic element 1, the second optoelectronic element 2, the third optoelectronic element 3, the fourth optoelectronic element 4, four openings 22, one opening 41, the micro-lens 40A, four openings 31, 32, 33 and 34, the first optical channel 61, the second optical channel 62, the third optical channel 63, the fourth optical channel 64, the transparent layer 71 and the transparent layer 72 are substantially the same or similar to those of the detecting units 50 shown in FIGS. 2B and 2C, and the detailed descriptions relating thereto can be referred to the above descriptions for the detecting units 50 of the optical imaging device 100, and are abbreviated hereinafter.

The optical imaging device 600 can be FSI or BSI. In the embodiment shown in FIGS. 6B and 6C, the optical imaging device 600 is BSI with the interconnect structure 12 similar to that of the optical imaging device 100 shown in FIGS. 2B and 2C disposed under the substrate 10, and the illustrated optical imaging device 600 is preferably BSI to provide a reduced destructive interference and better quantum efficiency. Moreover, the first optoelectronic element 1, the second optoelectronic element 2, the third optoelectronic element 3 and the fourth optoelectronic element 4 in each of the inner detecting units 51 of the optical imaging device 600 receive inclined incident light. When the optical imaging device 600 is BSI, the optical imaging device 600 may have more sensitivity to inclined incident light 80 than a FSI device.

In some embodiments, the optical imaging device 600 further includes a multi-layered optical filter 11 disposed between the opaque layer 20 and the opaque layer 40 as described for the optical imaging device 100 shown in FIGS. 2B and 2C.

Each of the periphery detecting units 55 is different from each of the inner detecting units 51 in that the opaque layer 20 and the opaque layer 30 in each of the periphery detecting units 55 are not patterned or opened as those in each of the inner detecting units 51. The periphery detecting units 55 are provided to mainly receive light transmitting in inward direction to the combined range of the periphery detecting units 55 and the inner detecting units 51 to further enlarge the FOV of the optical imaging device 600.

In some embodiments, as shown in FIG. 6B, each of the periphery detecting units 55 includes a first optoelectronic element 1, a second optoelectronic element 2, a third optoelectronic element 3 and a fourth optoelectronic element 4 each disposed in the substrate 10 and spaced apart from each other, similar to each of the inner detecting units 51. In the illustrated embodiment, the first optoelectronic element 1, the second optoelectronic element 2, the third optoelectronic element 3 and the fourth optoelectronic element 4 in each of the periphery detecting units 55 are defined by the same way as those in each of the inner detecting units 51. In some embodiments, as shown in FIG. 6B, the opaque layer 20 includes one opening 22 exposing the first optoelectronic element 1, but the opaque layer 20 covers the fourth optoelectronic element 4. As a result, the fourth optoelectronic element 4 covered by the opaque layer 20 is considered as a dummy optoelectronic element, and the pixel 504 having the covered fourth optoelectronic element 4 is considered as a dummy pixel. In such embodiments, an opening 31 is formed in the opaque layer 30, and a micro-lens 40A is formed and embedded in an opening 41 in the opaque layer 40. Thus, each of the periphery detecting units 55 is configured to form a first optical channel 61 connecting the micro-lens 40A to the first optoelectronic element 1 through the opening 31, but no optical channel is formed between the micro-lens 40A and the fourth optoelectronic element 4. In FIG. 6A, in four optoelectronic elements of each of the detecting units 51 and 55, the closest to and the farthest from the center C of the matrix are respectively defined as the first optoelectronic element 1 and the fourth optoelectronic element 4. As a result, the periphery detecting units 55 mainly receive light 80 transmitting in inward direction to the combined range of the periphery detecting units 55 and the inner detecting units 51, and therefore contribute to further enlarge the FOV of the optical imaging device 600.

The matrix of the inner detecting units 51 and each of the inner detecting units 51 may be rectangular as shown in FIG. 6A or polygonal as the described for the detecting units 50. In some embodiments, each of the periphery detecting units 55 is also rectangular. In some embodiments, each of the periphery detecting units 55 has substantially the same dimensions as each of the inner detecting units 51. In some alternative embodiments, at least some of the periphery detecting units 55 have different dimension from each of the inner detecting units 51. In the embodiments where the inner detecting units 51 and the periphery detecting units 55 are rectangular and have substantially the same dimensions, the periphery detecting units 55 include four rows of side detecting units 52 respectively in contact with four sides of the matrix of the inner detecting units 51. In the embodiments where the periphery detecting units 55 include four rows of side detecting units 52, the periphery detecting units 55 may further include four corner detecting units 53 respectively in contact with four corners of the matrix of the inner detecting units 51 and between two neighboring side detecting units 52.

In the embodiments where the periphery detecting units 55 include four rows of side detecting units 52, the side detecting units 52 may include more than one optical channel to introduce light 80 transmitting in inward directions or relatively inward directions to the combined range of the periphery detecting units 55 and the inner detecting units 51. In FIG. 6A, the side detecting units 52 include two rows of side detecting units 52X arranged in a direction substantially parallel to x-axis and the other two rows of side detecting units 52Y arranged in a direction substantially parallel to y-axis. The two rows of side detecting units 52X are respectively in contact with two opposite sides substantially parallel to x-axis of the matrix of the inner detecting units 51. The two rows of side detecting units 52Y are respectively in contact with the other two opposite sides substantially parallel to y-axis of the matrix of the inner detecting units 51.

In FIG. 6C, one of the side detecting units 52X and one of the side detecting units 52Y are shown. Referring to FIGS. 6A and 6C, the second optoelectronic elements 2 are closer to x-axis as described for the detecting units 50 of FIG. 2A. Regarding to the side detecting units 52X, light 80 from the micro-lens 40A to the second optoelectronic element 2 may be considered to be in relatively inward direction to the combined range of the periphery detecting units 55 and the inner detecting units 51. Therefore, it is preferred that each of the side detecting units 52X further includes an additional opening 22 in the opaque layer 20, exposing the second optoelectronic element 2, and an additional opening 32 in the opaque layer 30, such that each of the side detecting units 52X is configured to form a second optical channel 62 extending from the micro-lens 40A to the second optoelectronic element 2 through the additional opening 32. Therefore, the side detecting units 52X may contribute to further enlarge the FOV of the optical imaging device 600.

Referring to FIGS. 6A and 6C, the third optoelectronic elements 3 are closer to y-axis as described for the detecting units 50 of FIG. 2A. Regarding to the side detecting units 52Y, light 80 from the micro-lens 40A to the third optoelectronic element 3 may be considered to be in relatively inward direction to the combined range of the periphery detecting units 55 and the inner detecting units 51. Therefore, it is preferred that each of the side detecting units 52Y further includes an additional opening 22 in the opaque layer 20, exposing the third optoelectronic element 3, and an additional opening 33 in the opaque layer 30, such that each of the side detecting units 52Y is configured to form a third optical channel 63 extending from the micro-lens 40A to the third optoelectronic element 3 through the additional opening 33. Therefore, the side detecting units 52Y may contribute to further enlarge the FOV of the optical imaging device 600.

In FIG. 6A with reference to FIG. 6B, each of the corner detecting units 53 includes only one optical channel (the first optical channel 61). In alternative embodiments, at least one of the corner detecting units 53 may further include more optical channels connecting the micro-lens 40A to any of the second to fourth optoelectronic elements 2 to 4 as desired.

Figure 7:
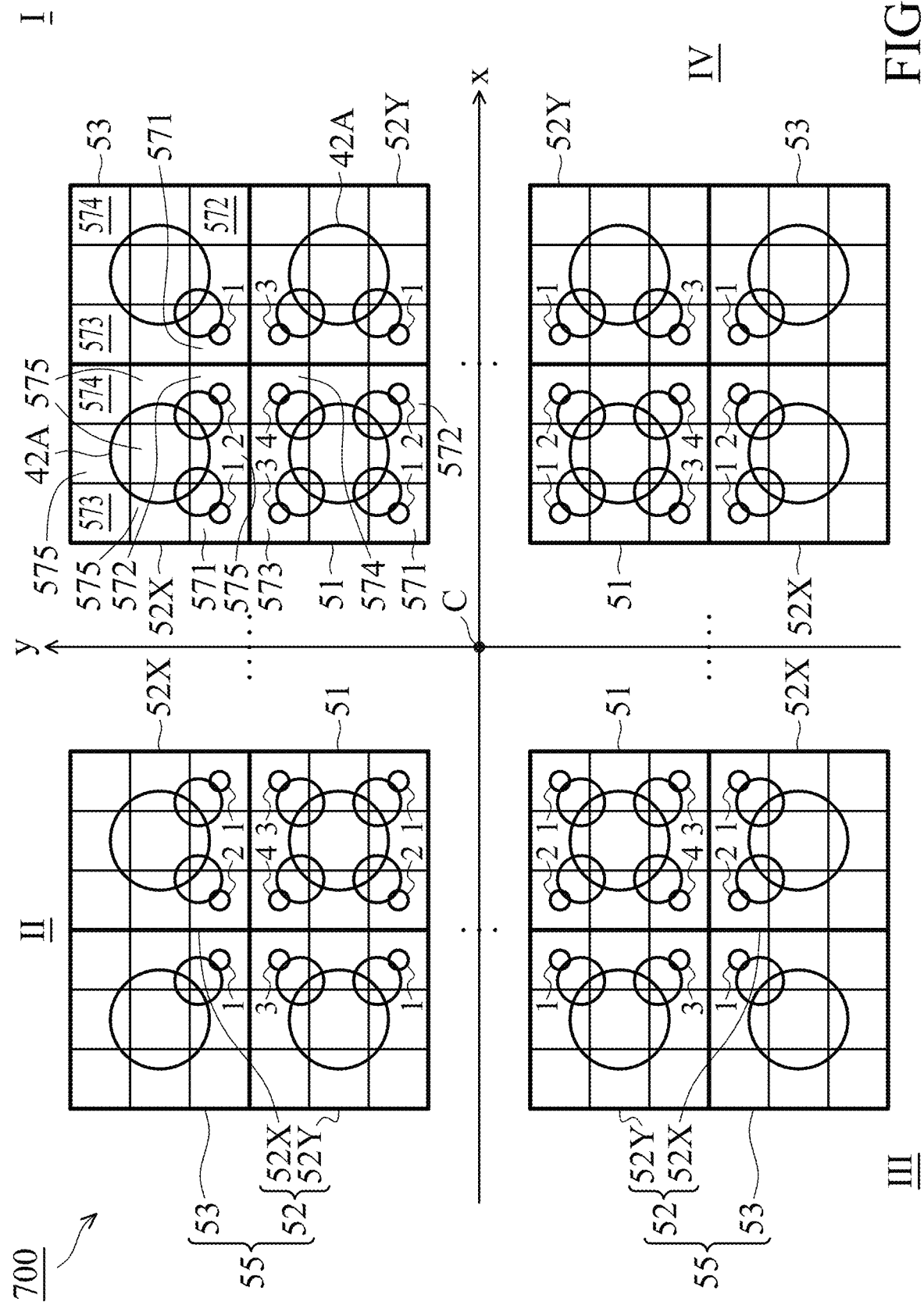
FIG. 7 shows a top view schematically illustrating some of the alternative embodiments of an optical imaging device, according to the present disclosure.

FIG. 7 shows a top view schematically illustrating an optical imaging device 700, according to some of the alternative embodiments of the present disclosure. The optical imaging device 700 includes a plurality of inner detecting units 51 arranged in a matrix and a plurality of periphery detecting units 55 surrounding the matrix as shown in FIG. 7. In FIG. 7, the detecting units 51 and 55 near corners of the matrix are representatively shown. The optical imaging device 700 shown in FIG. 7 and the optical imaging device 600 shown in FIGS. 6A through 6C are similar but are different in the distribution of the pixels in each of the inner detecting units 51 and the periphery detecting units 55. The cross-sectional views of the optical imaging device 700 shown in FIG. 7 are similar to those shown in FIGS. 6B, 6C, 2B and 2C, except that the optical imaging device 700 includes one micro-lens 42A embedded in the opening 41 in each of the inner detecting units 51 and the periphery detecting units 55 instead of the micro-lens 40A of the optical imaging device 600. The micro-lens 42A is similar to the micro-lens 40A of the optical imaging device 600, except that the micro-lens 42A has greater diameter than that of the micro-lens 40A in some embodiments as subsequently described. The following descriptions about the cross-sectional structure of the optical imaging device 700 will refer to FIGS. 6B, 6C, 2B and 2C.

In FIG. 7 with reference to FIGS. 6B and 6C and further with reference to FIGS. 2B and 2C, the optical imaging device 700 includes a plurality of inner detecting units 51 and a plurality of periphery detecting units 55, and the plurality of inner detecting units 51 and the plurality of periphery detecting units 55 include a substrate 10 and an opaque-layer stack over the substrate 10. The opaque-layer stack includes an opaque layer 20 over the substrate 10 and an opaque layer 40 over the opaque layer 20. The opaque-layer stack further includes an opaque layer 30 between the opaque layer 20 and the opaque layer 40. In each of the inner detecting units 51 and the periphery detecting units 55, except from the described differences, the details about the first optoelectronic element 1, the second optoelectronic element 2, the third optoelectronic element 3, the fourth optoelectronic element 4, four openings 22, one opening 41, four openings 31, 32, 33 and 34, the first optical channel 61, the second optical channel 62, the third optical channel 63, the fourth optical channel 64, the transparent layer 71, the transparent layer 72, the multi-layered optical filter 11 and the interconnect structure 12 are substantially the same or similar to those of the inner detecting units 51 and the periphery detecting units 55 of the optical imaging device 600 shown in FIGS. 6A through 6C with reference to FIGS. 2B and 2C, and the detailed descriptions relating thereto can be referred to the above descriptions for the optical imaging device 600 and 100, and are abbreviated hereinafter.

Each of the inner detecting units 51 and periphery detecting units 55 as shown in FIG. 6A is divided into four pixels arranged in a 2×2 array with the first optoelectronic element 1, the second optoelectronic element 2, the third optoelectronic element 3 and the fourth optoelectronic element 4 respectively disposed in the four pixels 501, 502, 503 and 504, while each of the inner detecting units 51 and periphery detecting units 55 as shown in FIG. 7 is divided into nine pixels arranged in a 3×3 array with the first optoelectronic element 1, the second optoelectronic element 2, the third optoelectronic element 3 and the fourth optoelectronic element 4 respectively disposed in the four pixels 571, 572, 573 and 574 at corners of the 3×3 array. The other five pixels 575 in each of the inner detecting units 51 and the periphery detecting units 55 may be provided with optoelectronic elements as the four pixels 571, 572, 573 and 574. In some embodiments, the optoelectronic elements in the other five pixels 575 in each of the inner detecting units 51 and the periphery detecting units 55 are covered by the opaque layer 20 (referring to FIGS. 6A and 6B). As a result, the optoelectronic elements covered by the opaque layer 20 are considered as dummy optoelectronic elements, and the pixels 575 having the covered optoelectronic elements are considered as dummy pixels. In at least one of such embodiments, at least one of the dummy pixels 575 interposes two of the pixels 571, 572, 573 and 574. In some alternative embodiments, each of the inner detecting units 51 may further include one or more optical channels connecting the micro-lens 42A to the desired optoelectronic element or optoelectronic elements in the other five pixels as the described optical channels 61-64. In some alternative embodiments, each of the inner detecting units 55 may further include one or more optical channels other than the described optical channels 61-63 connecting the micro-lens 42A to the desired optoelectronic element or optoelectronic elements other than the optoelectronic elements 1-3 as the described optical channels 61-63.

The embodiment of the optical imaging device 700 shown in FIG. 7 includes inner detecting units 51 and periphery detecting units 55 each divided into nine pixels arranged in a 3×3 array. In some embodiments, the nine pixels in the 3×3 array may provide more margins than the four pixels in the 2×2 array as shown in FIGS. 2A and 6A to adjust the diameter of the micro-lens 42A. In some embodiments, the optical imaging device 700 shown in FIG. 7 may provide the micro-lens 42A with diameter greater than that of the micro-lens 40A of the optical imaging device 100 shown in FIG. 2A and the optical imaging device 600 shown in FIG. 6A, and therefore, may provide more optical sensitivity than the optical imaging device 100 shown in FIG. 2A and the optical imaging device 600 shown in FIG. 6A.

Figure 8:
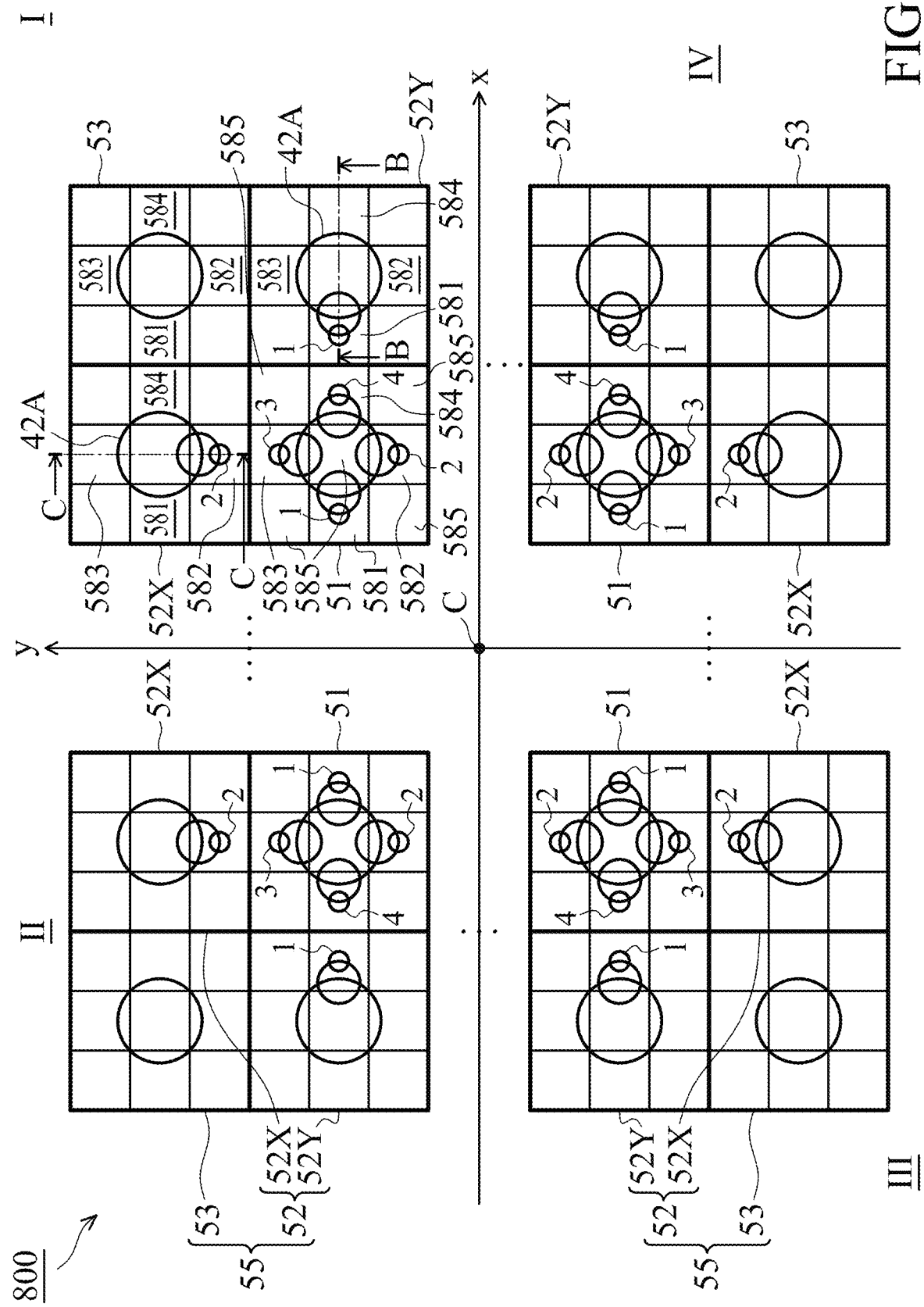
FIG. 8 shows a top view schematically illustrating some of the alternative embodiments of an optical imaging device, according to the present disclosure.

FIG. 8 shows a top view schematically illustrating an optical imaging device 800, according to some of the alternative embodiments of the present disclosure. The optical imaging device 800 includes a plurality of inner detecting units 51 arranged in a matrix and a plurality of periphery detecting units 55 surrounding the matrix as shown in FIG. 8. In FIG. 8, the detecting units 51 and 55 near corners of the matrix are representatively shown. The optical imaging device 800 shown in FIG. 8 and the optical imaging device 700 shown in FIG. 7 are similar but are different in the distribution of optoelectronic elements in the pixels in each of the inner detecting units 51 and the periphery detecting units 55 and the distribution of optical channels in the periphery detecting units 55. Therefore, as to the optical imaging device 700 shown in FIG. 7, the following descriptions about the cross-sectional structure of the optical imaging device 800 will also refer to FIGS. 6B, 6C, 2B and 2C.

In FIG. 8 with reference to FIGS. 7, 6A, 6B and 6C and further with reference to FIGS. 2B and 2C, the optical imaging device 800 includes a plurality of inner detecting units 51 and a plurality of periphery detecting units 55, and the plurality of inner detecting units 51 and the plurality of periphery detecting units 55 include a substrate 10 and an opaque-layer stack over the substrate 10. The opaque-layer stack includes an opaque layer 20 over the substrate 10 and an opaque layer 40 over the opaque layer 20. The opaque-layer stack further includes an opaque layer 30 between the opaque layer 20 and the opaque layer 40. In each of the inner detecting units 51 and the periphery detecting units 55, except from the described differences, the details about the first optoelectronic element 1, the second optoelectronic element 2, the third optoelectronic element 3, the fourth optoelectronic element 4, four openings 22, one opening 41, the micro-lens 42A, four openings 31, 32, 33 and 34, the first optical channel 61, the second optical channel 62, the third optical channel 63, the fourth optical channel 64, the transparent layer 71, the transparent layer 72, the multi-layered optical filter 11 and the interconnect structure 12 are substantially the same or similar to those of the inner detecting units 51 and the periphery detecting units 55 of the optical imaging device 700 shown in FIG. 7 with reference to FIGS. 6A through 6C and further with reference to FIGS. 2B and 2C, and the detailed descriptions relating thereto can be referred to the above descriptions for the optical imaging devices 700, 600 and 100, and are abbreviated hereinafter. Further, some of the first optoelectronic elements 1, the second optoelectronic elements 2, the third optoelectronic elements 3 and the fourth optoelectronic element 4 are covered by the opaque layer 20 and therefore are not shown in the periphery detecting units 55 in FIG. 8.

As shown in FIG. 8, in four optoelectronic elements of each of the inner detecting units 51 and the periphery detecting units 55, the fourth optoelectronic element 4 is farther away from the center C of the matrix of the inner detecting units 51 than the first optoelectronic element 1, and the third optoelectronic element 3 is farther away from the center C of the matrix of the inner detecting units 51 than the second optoelectronic element 2. The differences in the arrangement of the first optoelectronic element 1, the second optoelectronic element 2, the third optoelectronic element 3, and the fourth optoelectronic element 4 from the optical imaging devices 700, 600 and 100 do not substantially affect the cross-sectional features and structures. In some embodiments the distributions of the first optoelectronic element 1, the second optoelectronic element 2, the third optoelectronic element 3 and the fourth optoelectronic element 4 in regions of quadrant I, quadrant II, quadrant III and quadrant IV are symmetrical with each other relative to the x-axis, the y-axis, or the center C.

The matrix of the inner detecting units 51 and each of the inner detecting units 51 may be rectangular as shown in FIG. 8 or polygonal as the described for the detecting units 50. In some embodiments, each of the periphery detecting units 55 is also rectangular. In some embodiments, each of the periphery detecting units 55 has substantially the same dimensions as each of the inner detecting units 51. In some alternative embodiments, at least some of the periphery detecting units 55 have different dimension from each of the inner detecting units 51. In the embodiments where the inner detecting units 51 and the periphery detecting units 55 are rectangular and have substantially the same dimensions, the periphery detecting units 55 include four rows of side detecting units 52 respectively in contact with four sides of the matrix of the inner detecting units 51. In the embodiments where the periphery detecting units 55 include four rows of side detecting units 52, the periphery detecting units 55 may further include four corner detecting units 53 respectively in contact with four corners of the matrix of the inner detecting units 51 and between two neighboring side detecting units 52. In FIG. 8, the side detecting units 52 include two rows of side detecting units 52X arranged in a direction substantially parallel to x-axis and the other two rows of side detecting units 52Y arranged in a direction substantially parallel to y-axis. The two rows of side detecting units 52X are respectively in contact with two opposite sides substantially parallel to x-axis of the matrix of the inner detecting units 51. The two rows of side detecting units 52Y are respectively in contact with the other two opposite sides substantially parallel to y-axis of the matrix of the inner detecting units 51. The cross-sectional view of a side detecting unit 52Y along line B-B in FIG. 8 is equivalent to that shown in FIG. 6B, and the cross-sectional view of a side detecting unit 52X along line C-C in FIG. 8 is equivalent to that of the side detecting unit 52X shown in FIG. 6C.

In some embodiments, as shown in FIG. 8, each of the inner detecting units 51 and the periphery detecting units 55 is divided into nine pixels arranged in a 3×3 array, and the first optoelectronic element 1, the second optoelectronic element 2, the third optoelectronic element 3 and the fourth optoelectronic element 4 are respectively disposed in the four middle pixels 581, 582, 583 and 584 on four respective sides of the 3×3 array. The other five pixels 585 in each of the inner detecting units 51 and the periphery detecting units 55 may be provided with optoelectronic elements as the four pixels 581, 582, 583 and 584. In some embodiments, the optoelectronic elements in the other five pixels 585 in each of the inner detecting units 51 and the periphery detecting units 55 are covered by the opaque layer 20 (referring to FIGS. 6A and 6B). As a result, the optoelectronic elements covered by the opaque layer 20 are considered as dummy optoelectronic elements, and the pixels 585 having the covered optoelectronic elements are considered as dummy pixels. In at least one of such embodiments, at least one of the dummy pixels 585 interposes two of the pixels 581, 582, 583 and 584.

Each of the periphery detecting units 55 is different from each of the inner detecting units 51 in that the opaque layer 20 and the opaque layer 30 in each of the periphery detecting units 55 are not patterned or opened as those in each of the inner detecting units 51. The periphery detecting units 55 are provided to mainly receive light transmitting in inward direction to the combined range of the periphery detecting units 55 and the inner detecting units 51 to further enlarge the FOV of the optical imaging device 800.

In FIG. 8 with reference to FIG. 6C, the second optoelectronic elements 2 are closer to the center C. Regarding to the side detecting units 52X, light 80 from the micro-lens 42A to the second optoelectronic element 2 may be considered to be in relatively inward direction to the combined range of the periphery detecting units 55 and the inner detecting units 51. Therefore, in the embodiment shown in FIG. 8, each of the side detecting units 52X includes an opening 22 in the opaque layer 20, exposing the second optoelectronic element 2, and an opening 32 in the opaque layer 30, such that each of the side detecting units 52X is configured to form a second optical channel 62 extending from the micro-lens 42A to the second optoelectronic element 2 through the opening 32. Therefore, the side detecting units 52X may contribute to enlarge the FOV of the optical imaging device 800.

In FIG. 8 with reference to FIG. 6B, the first optoelectronic elements 1 are closer to the center C. Regarding to the side detecting units 52Y, light 80 from the micro-lens 42A to the first optoelectronic element 1 may be considered to be in relatively inward direction to the combined range of the periphery detecting units 55 and the inner detecting units 51. Therefore, in the embodiment shown in FIG. 8, each of the side detecting units 52Y includes an opening 22 in the opaque layer 20, exposing the first optoelectronic element 1, and an opening 31 in the opaque layer 30, such that each of the side detecting units 52Y is configured to form a first optical channel 61 extending from the micro-lens 42A to the first optoelectronic element 1 through the opening 31. Therefore, the side detecting units 52Y may contribute to enlarge the FOV of the optical imaging device 800.

In FIG. 8, there is no optical channel formed in each of the corner detecting units 53. In alternative embodiments, at least one of the detecting units 53 may further include at least one optical channel connecting the micro-lens 42 to any of the first to fourth optoelectronic elements 1 to 4 as desired.

In FIG. 8, there is only one optical channel formed in each of the side detecting units 52. In alternative embodiments, at least one of the side detecting units 52 may further include more optical channels as desired. One of such alternative embodiments is shown in FIGS. 9A and 9B.

Figure 9A:
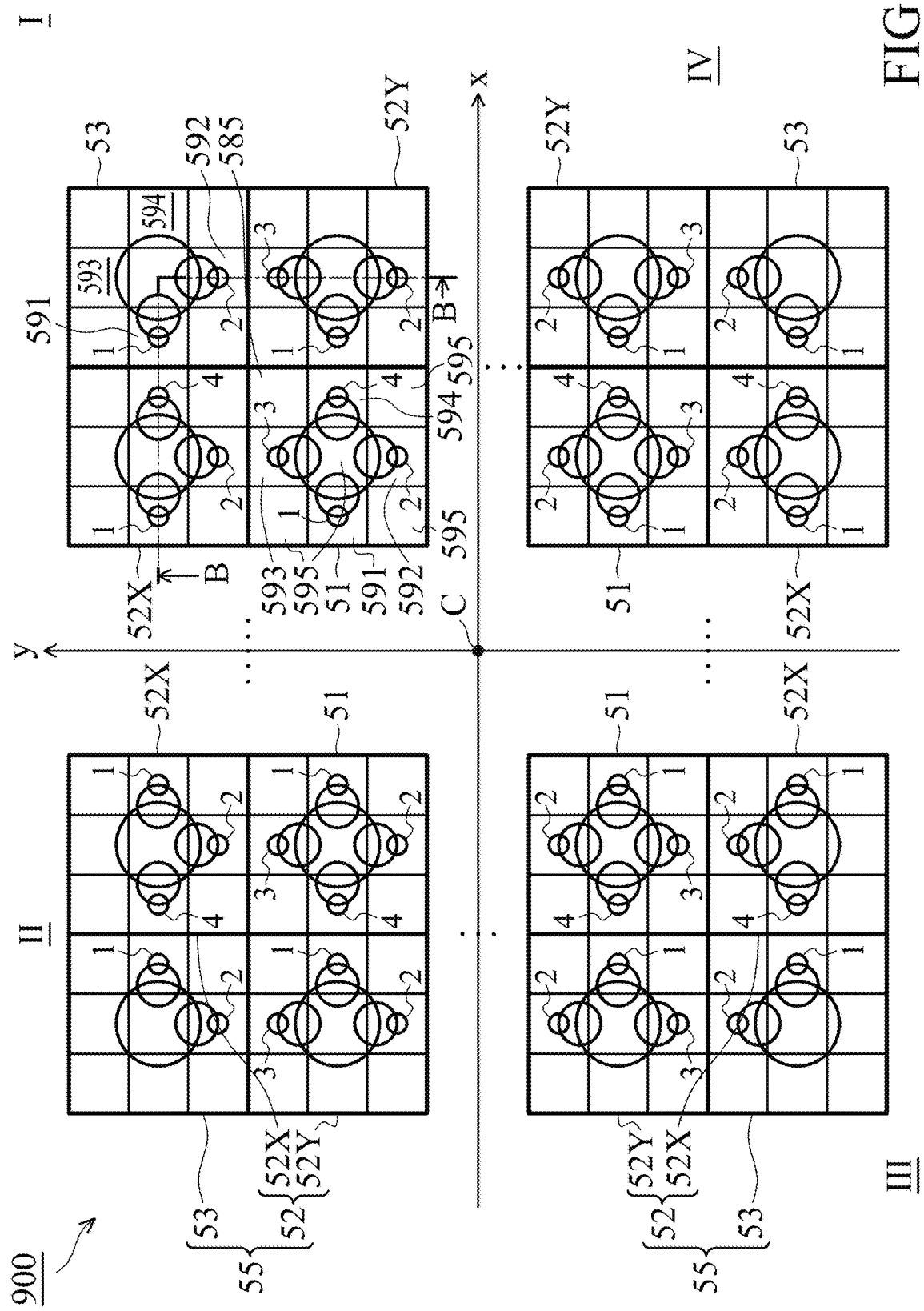
FIG. 9A shows a top view schematically illustrating some of the alternative embodiments of an optical imaging device, according to the present disclosure.
Figure 9B:
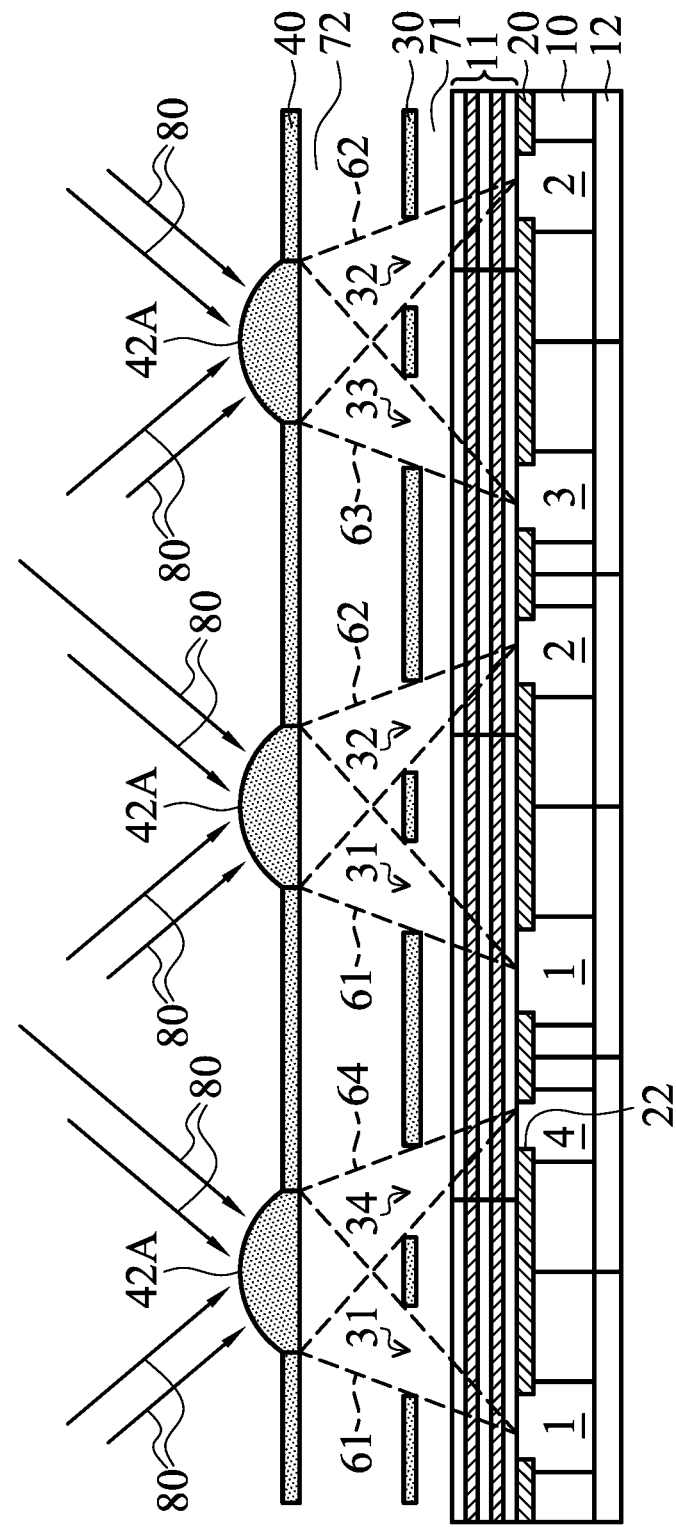
FIG. 9B shows a cross-sectional view along line B-B of FIG. 9A.

FIG. 9A shows a top view schematically illustrating an optical imaging device 900, according to some of the alternative embodiments of the present disclosure. The optical imaging device 900 includes a plurality of inner detecting units 51 arranged in a matrix and a plurality of periphery detecting units 55 surrounding the matrix as shown in FIG. 9A. In FIG. 9A, the detecting units 51 and 55 near corners of the matrix are representatively shown. The optical imaging device 900 shown in FIG. 9A and the optical imaging device 800 shown in FIG. 8 are similar but are different in the distribution of optical channels in the periphery detecting units 55. FIG. 9B shows a cross-sectional view along line B-B of FIG. 9A. Moreover, as to the optical imaging devices 700 and 800 shown in FIGS. 7 and 8, the following descriptions about the cross-sectional structure of the optical imaging device 900 will also refer to FIGS. 6B, 6C, 2B and 2C.

In FIG. 9A with reference to FIGS. 8, 7, 6A, 6B and 6C and further with reference to FIGS. 2B and 2C, the optical imaging device 900 includes a plurality of inner detecting units 51 and a plurality of periphery detecting units 55, and the plurality of inner detecting units 51 and the plurality of periphery detecting units 55 include a substrate 10 and an opaque-layer stack over the substrate 10. The opaque-layer stack includes an opaque layer 20 over the substrate 10 and an opaque layer 40 over the opaque layer 20. The opaque-layer stack further includes an opaque layer 30 between the opaque layer 20 and the opaque layer 40. In each of the inner detecting units 51 and the periphery detecting units 55, except from the described differences, the details about the first optoelectronic element 1, the second optoelectronic element 2, the third optoelectronic element 3, the fourth optoelectronic element 4, four openings 22, one opening 41, the micro-lens 42A, four openings 31, 32, 33 and 34, the first optical channel 61, the second optical channel 62, the third optical channel 63, the fourth optical channel 64, the transparent layer 71, the transparent layer 72, the multi-layered optical filter 11, the interconnect structure 12, the side detecting units 52, the side detecting units 52X, the side detecting units 52Y and the corner detecting units 53 are substantially the same or similar to those of the inner detecting units 51 and the periphery detecting units 55 of the optical imaging device 800 shown in FIG. 8 with reference to FIGS. 7 and 6A through 6C and further with reference to FIGS. 2B and 2C, and the detailed descriptions relating thereto can be referred to the above descriptions for the optical imaging devices 800, 700, 600 and 100, and are abbreviated hereinafter. Further, some of the third optoelectronic elements 3 and the fourth optoelectronic element 4 are covered by the opaque layer 20 and therefore are not shown in the periphery detecting units 55 in FIG. 9.

As shown in FIG. 9A, four optoelectronic elements of each of the inner detecting units 51 and the periphery detecting units 55 are defined as those described for the optical imaging device 800. In some embodiments the distributions of the first optoelectronic element 1, the second optoelectronic element 2, the third optoelectronic element 3 and the fourth optoelectronic element 4 in regions of quadrant I, quadrant II, quadrant III and quadrant IV are symmetrical with each other relative to the x-axis, the y-axis, or the center C.

In some embodiments, as shown in FIG. 9A, each of the inner detecting units 51 and the periphery detecting units 55 is divided into nine pixels arranged in a 3×3 array, and the first optoelectronic element 1, the second optoelectronic element 2, the third optoelectronic element 3 and the fourth optoelectronic element 4 are respectively disposed in the four middle pixels 591, 592, 593 and 594 on four respective sides of the 3×3 array. The other five pixels 595 in each of the inner detecting units 51 and the periphery detecting units 55 may be provided with optoelectronic elements as the four pixels 591, 592, 593 and 594. In some embodiments, the optoelectronic elements in the other five pixels 595 in each of the inner detecting units 51 and the periphery detecting units 55 are covered by the opaque layer 20 (referring to FIGS. 6A and 6B). As a result, the optoelectronic elements covered by the opaque layer 20 are considered as dummy optoelectronic elements, and the pixels 595 having the covered optoelectronic elements are considered as dummy pixels. In at least one of such embodiments, at least one of the dummy pixels 595 interposes two of the pixels 591, 592, 593 and 594.

Each of the periphery detecting units 55 of the optical imaging device 900 shown in FIGS. 9A and 9B is different from each of the periphery detecting units 55 of the optical imaging device 800 shown in FIG. 8 with reference to FIGS. 6B and 6C in that each of the periphery detecting units 55 of the optical imaging device 900 includes two openings 22 in the opaque layer 20, exposing the first optoelectronic element 1 and the second optoelectronic element 2, and two openings 31 and 32 in the opaque layer 30, such that each of the periphery detecting units 55 is configured to form a first optical channel 61 extending from the micro-lens 42A to the first optoelectronic element 1 through the opening 31 and a second optical channel 62 extending from the micro-lens 42A to the second optoelectronic element 2 through the opening 32 because the first optoelectronic elements 1 and the second optoelectronic elements 2 are closer to the center C, light 80 from the micro-lenses 42A to the first optoelectronic elements 1 and from the micro-lenses 42A to the second optoelectronic elements 2 may be considered to be in relatively inward directions to the combined range of the periphery detecting units 55 and the inner detecting units 51. Therefore, the periphery detecting units 55 may contribute to enlarge the FOV of the optical imaging device 900.

In some embodiments, as shown in FIGS. 9A and 9B, each of the side detecting units 52X further includes one more opening 22 in the opaque layer 20, exposing the fourth optoelectronic element 4, and an opening 34 in the opaque layer 30, such that each of the side detecting units 52X is configured to further form a fourth optical channel 64 extending from the micro-lens 42A to the fourth optoelectronic element 4 through the opening 34. In some embodiments, as shown in FIGS. 9A and 9B, each of the side detecting units 52Y further includes one more opening 22 in the opaque layer 20, exposing the third optoelectronic element 3, and an opening 33 in the opaque layer 30, such that each of the side detecting units 52Y is configured to further form a third optical channel 63 extending from the micro-lens 42A to the third optoelectronic element 3 through the opening 33.

Figure 10A:
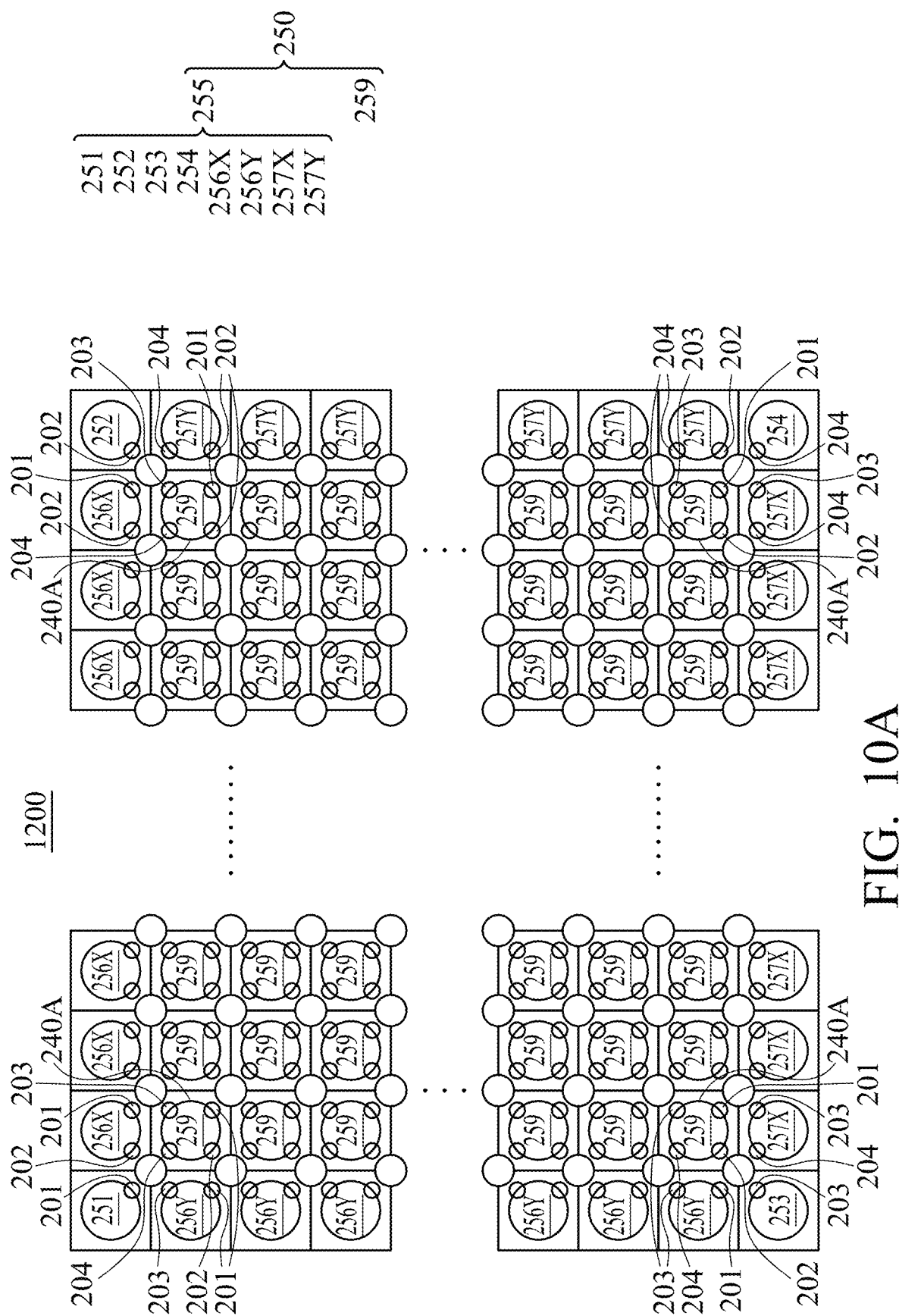
FIG. 10A shows a top view schematically illustrating some of the alternative embodiments of an optical imaging device, according to the present disclosure.

FIG. 10A shows a top view schematically illustrating an optical imaging device 1200, according to some of the alternative embodiments of the present disclosure. FIGS. 10B-10E shows parts of the optical imaging device 1200 shown in FIG. 10A. The optical imaging device 1200 includes a plurality of detecting units 250 arranged in a matrix. In FIG. 10A, the detecting units 250 near corners of the matrix are representatively shown. In some embodiments, each of the detecting units 250 includes a first optoelectronic element 201, a second optoelectronic element 202, a third optoelectronic element 203, a fourth optoelectronic element 204, and a micro-lens 240A. In this embodiment, a plurality of openings 231 are provided, and each of the openings 231 is common to four detecting units 250 proximate thereto.

Figure 10B:
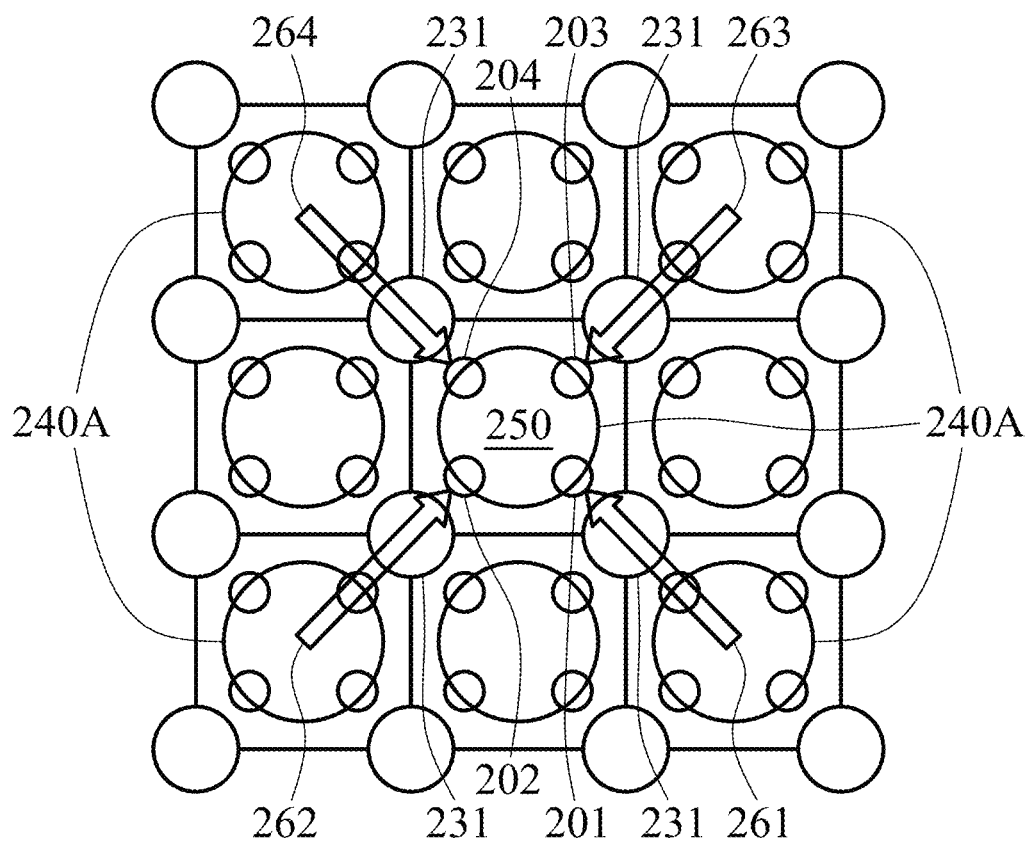
FIG. 10B shows a top view of parts of the optical imaging device shown in FIG. 10A.

In some embodiments, with reference to FIGS. 10A and 10B, each of the detecting units 250 is divided into a plurality of pixels (not shown), the quantity of the pixels is equal to or greater than the quantity of the optoelectronic elements 201-204 in each of the detecting units 250, and the optoelectronic elements 201-204 are respectively included in different pixels. In some embodiments, an opening 231 overlaps a plurality of pixels of different detecting units 250. For example, with reference to FIG. 10B, an opening 231 overlaps four pexels respectively included in four neighboring detecting units 250.

In some embodiments, as shown in FIG. 10A, the plurality of detecting units 250 includes a plurality of inner detecting units 259 and a plurality of periphery detecting units 255 surrounding the plurality of inner detecting units 259. In the embodiments where the matrix of the detecting units 250 is rectangular and the detecting units 250 have substantially the same dimensions, the periphery detecting units 255 comprise four rows of side detecting units 256X, 256Y, 257X and 257Y respectively in contact with four sides of the matrix of the inner detecting units 259. In the embodiments where the periphery detecting units 255 comprise four rows of side detecting units, the periphery detecting units 255 may further include four corner detecting units 251, 252, 253 and 254 respectively in contact with four corners of the matrix of the inner detecting units 259 and between two neighboring side detecting units. In the illustrated embodiment, the row of the side detecting units 256X is between the corner detecting units 251 and 252, the row of the side detecting units 256Y is between the corner detecting units 251 and 253, the row of the side detecting units 257X is between the corner detecting units 253 and 254, and the row of the side detecting units 257Y is between the corner detecting units 252 and 254.

The optical imaging device 100 of the embodiments shown in FIGS. 2A, 2B and 2C includes micolenses 40A each common to introduce light 80 to the first optoelectronic element 1, the second optoelectronic element 2, the third optoelectronic element 3 and the fourth optoelectronic element 4 in each of the detecting units 50, while the optical imaging device 500 of the embodiments shown in FIGS. 5A, 5B and 5C includes openings 76 in the opaque layer 75 each common to introduce light 80 to the first optoelectronic element 1, the second optoelectronic element 2, the third optoelectronic element 3 and the fourth optoelectronic element 4 in each of the detecting units 50. As compared thereto, the optical imaging device 1200 of this embodiment provides micro-lenses and openings in the opaque layer each common to introduce light to optoelectronic elements. In some embodiments, in each of the detecting units 250 of the optical imaging device 1200, the first optoelectronic element 201, the second optoelectronic element 202, the third optoelectronic element 203 and the fourth optoelectronic element 204 respectively receive light from the micro-lenses 240A of other detecting units 250. As a result, the range of incident angles of light incident to the optoelectronic elements 201-204 may be further increased.

FIG. 10B is a top view exemplarily illustrating details about optical paths to the first to fourth optoelectronic elements 201-204 of each of the detecting units 250. The 3×3 array of the detecting units 250 is taken from the matrix shown in FIG. 10A in some embodiments, and merely the optical paths to the central detecting unit 250 of the 3×3 array are shown for clarity. It is noted that the detecting units 250 of this embodiment are provided with the same or similar optical paths as those shown in FIG. 10B.

In the embodiment shown in FIG. 10B, regarding the central detecting unit 250, light is introduced from the micro-lens 240A of the lower-right detecting unit 250 to the first optoelectronic element 201 through the lower-right opening 231, forming a first optical channel 261 extending from the micro-lens 240A of the lower-right detecting unit 250 to the optoelectronic element 201 through the lower-right opening 231, light is introduced from the micro-lens 240A of the lower-left detecting unit 250 to the second optoelectronic element 202 through the lower-left opening 231, forming a second optical channel 262 extending from the micro-lens 240A of the lower-left detecting unit 250 to the optoelectronic element 202 through the lower-left opening 231, light is introduced from the micro-lens 240A of the upper-right detecting unit 250 to the third optoelectronic element 203 through the upper-right opening 231, forming a third optical channel 263 extending from the micro-lens 240A of the upper-right detecting unit 250 to the optoelectronic element 203 through the upper-right opening 231, and light is introduced from the micro-lens 240A of the upper-left detecting unit 250 to the fourth optoelectronic element 204 through the upper-left opening 231, forming a fourth optical channel 264 extending from the micro-lens 240A of the upper-left detecting unit 250 to the optoelectronic element 204 through the upper-left opening 231.

Figure 10C:
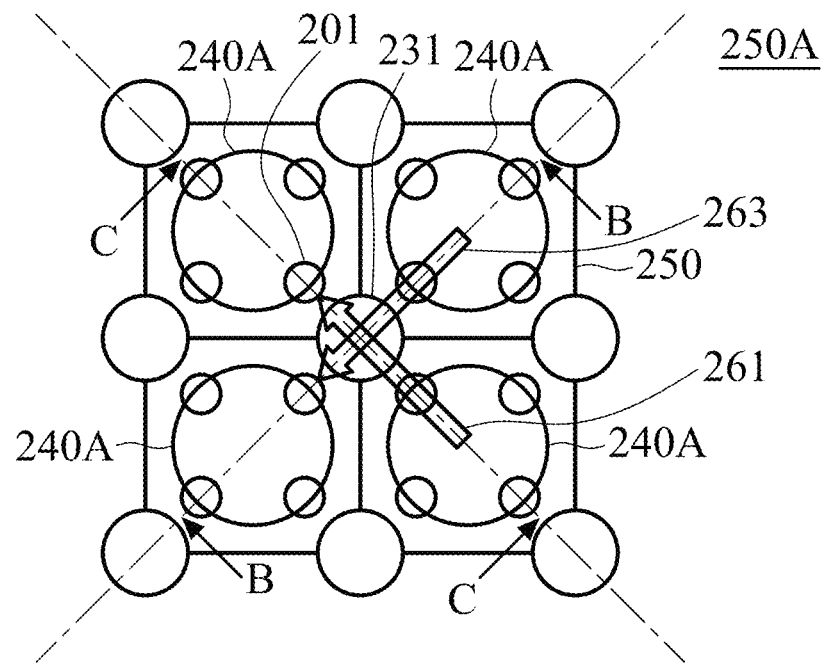
FIG. 10C shows a top view of parts of the optical imaging device shown in FIG. 10A.
Figure 10D:
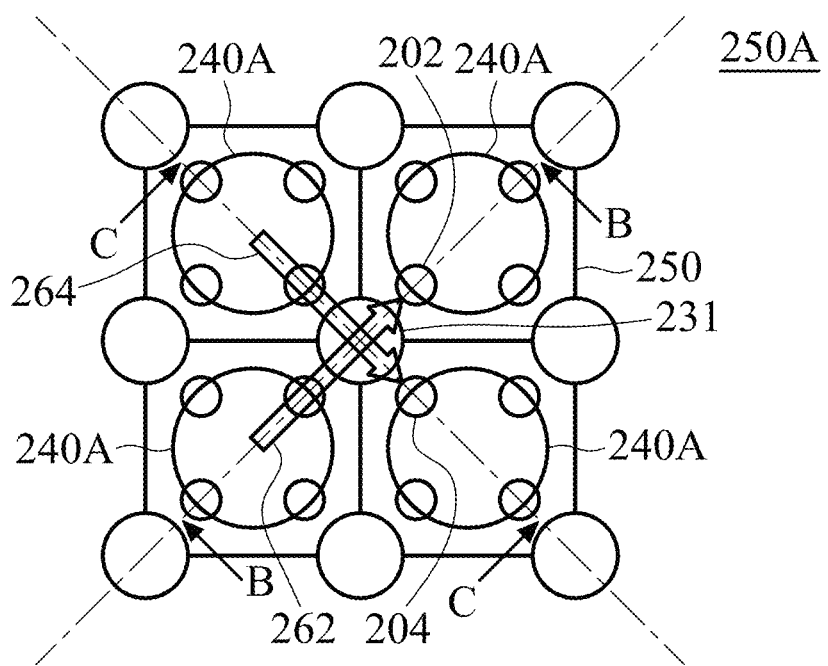
FIG. 10D shows a top view of parts of the optical imaging device shown in FIG. 10A.
Figure 10E:
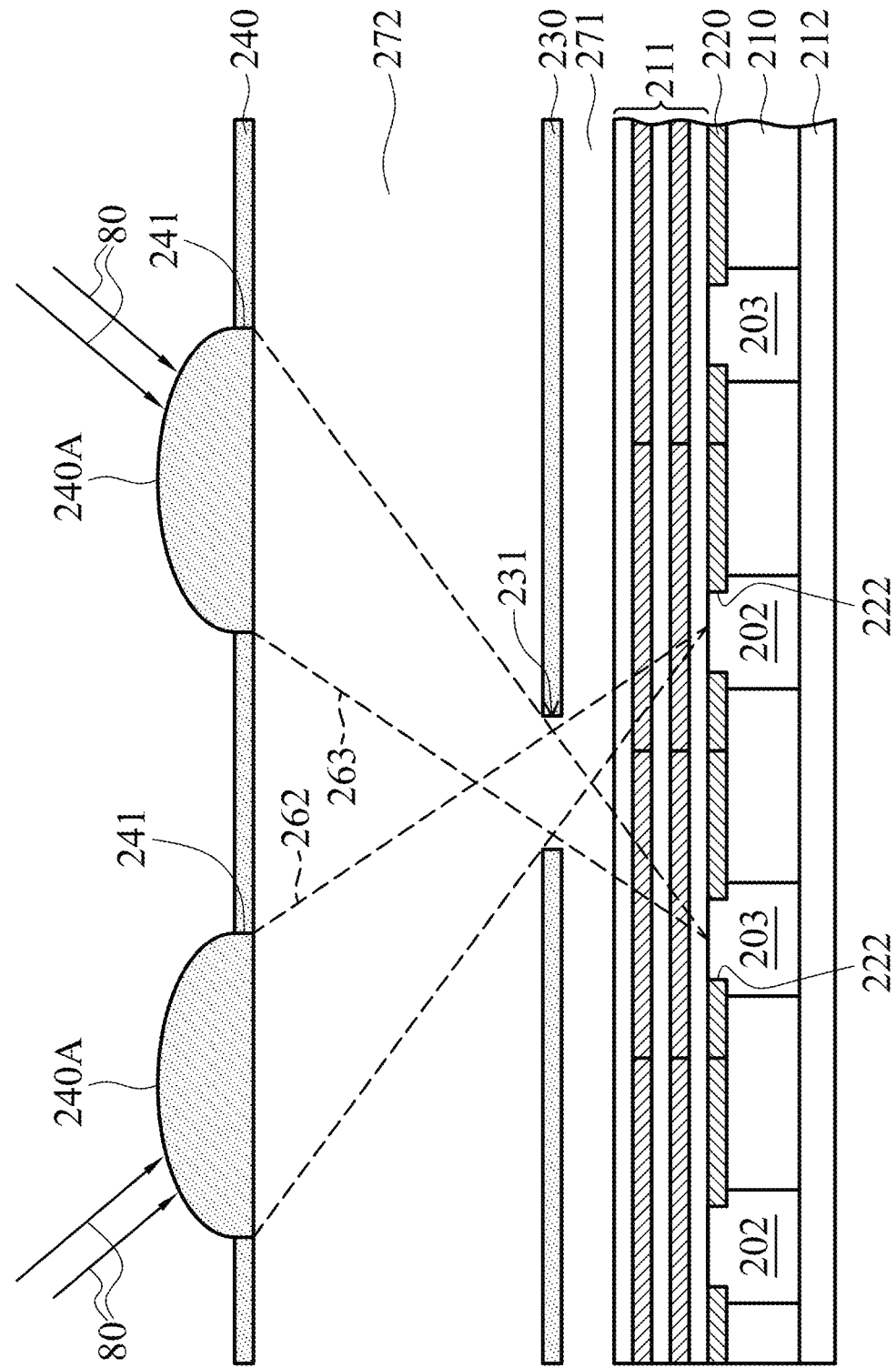
FIG. 10E shows a cross-sectional view along line B-B of FIGS. 10C and 10D.
Figure 10F:
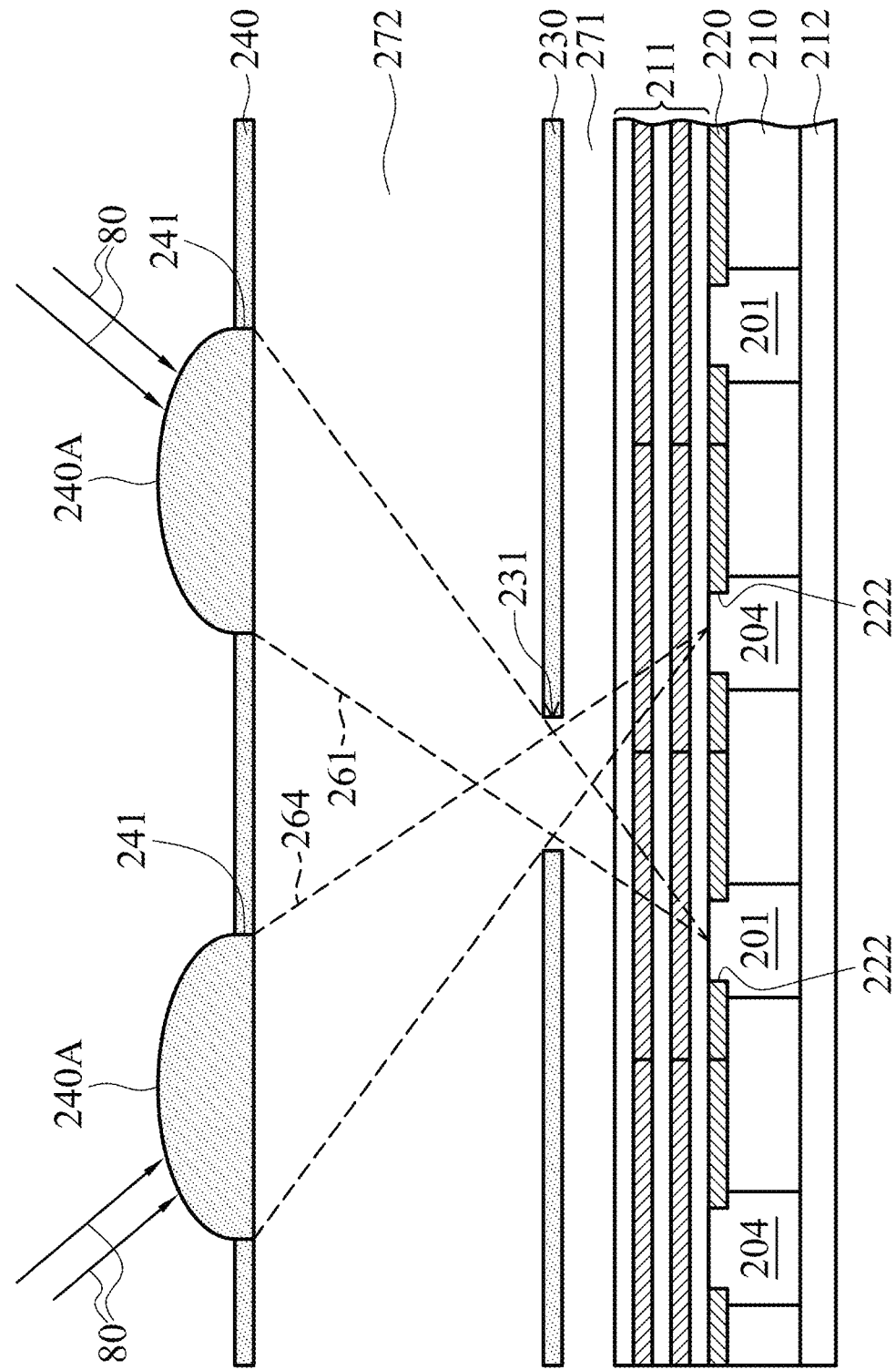
FIG. 10F shows a cross-sectional view along line C-C of FIGS. 10C and 10D.

The detecting units 250 may comprise a plurality of groups, such as groups 250A as shown in FIGS. 10C through 10F according to an aspect of common openings 231. FIGS. 10C and 10D show top views of one exemplary group 250A of the optical imaging device 1200 shown in FIG. 10A, and FIGS. 10E and 10F show cross-sectional views along the respective line B-B and line C-C of FIGS. 10C and 10D. In the illustrated embodiment, the first optical channel 261 overlaps with the fourth optical channel 264, and the third optical channel 263 overlaps with the second optical channel 262. Therefore, the top view of FIG. 10C merely shows the first optical channel 261 and the third optical channel 263 while the top view of FIG. 10D merely shows the second optical channel 262 and the fourth optical channel 264 for clarity, even though they are collectively present in the same optical imaging device 1200 (shown in FIG. 10A).

Referring to FIGS. 10A and 10C through 10F, the optical imaging device 1200 includes the plurality of detecting units 250, and the plurality of detecting units 250 includes a substrate 210 and an opaque-layer stack over the substrate 210. The plurality of pixels included in the plurality of detecting units 250 are respectively formed in the substrate 210. The opaque-layer stack includes an opaque layer 220 over the substrate 210, an opaque layer 230 over the opaque layer 220 and an opaque layer 240 over the opaque layer 230. In this embodiment, the micro-lenses 240A of the detecting units 250 are embedded in openings 241 in the opaque layer 240, and openings 231 of the detecting units 250 are formed in the opaque layer 230. The opaque layer 240 may also be referred as the micro-lens layer. In some embodiments, each of the detecting units 250 further includes four openings 222 in the opaque layer 220 to respectively expose the first optoelectronic element 201, the second optoelectronic element 202, the third optoelectronic element 203 and the fourth optoelectronic element 204 formed in the substrate 210. In some embodiments, the optical imaging device 1200 further comprises a multi-layered optical filter 211 disposed between the opaque layer 230 and the opaque layer 220. In some embodiments, a layer of transparent material or layers of transparent materials (e.g. transparent to visible light), such as a transparent layer 271 and a transparent layer 272 as shown in FIGS. 10E and 10F are formed between the opaque layer 220 and the opaque layer 240 to adjust the incident angles of light incident to the first optoelectronic element 201, the second optoelectronic element 202, the third optoelectronic element 203 and the fourth optoelectronic element 204. In embodiments where the transparent layer 271 is formed, the multi-layered optical filter 211 is disposed between the opaque layer 220 and the transparent layer 271. In the illustrated embodiment, the optical imaging device 1200 is BSI with the interconnect structure 212 disposed under the substrate 210. In some embodiments, the first optoelectronic element 201, the second optoelectronic element 202, the third optoelectronic element 203 and the fourth optoelectronic element 204 in each of the detecting units 250 are CMOS image sensors comprising photodiodes electrically connected to transistors electrically connected to the interconnect structure 212. In some embodiment, the photodiodes are organic photodiodes. In this embodiment, the combinations of materials and process of the opaque layers 220, 230 and 240, the micro-lenses 240A, the openings 222 and 231, the multi-layered optical filter 211, the transparent layers 271 and 272, the substrate 210, the first optoelectronic element 201, the second optoelectronic element 202, the third optoelectronic element 203, the fourth optoelectronic element 204 and the interconnect structure 212 are similar to those of the opaque layers 20, 30 and 40, the micro-lenses 40A, the openings 22 and 31, the multi-layered optical filter 11, the transparent layers 71 and 72, the substrate 10, the first optoelectronic element 1, the second optoelectronic element 2, the third optoelectronic element 3, the fourth optoelectronic element 4 and the interconnect structure 12 of the optical imaging device 100 shown in FIGS. 2B and 2C. The detailed descriptions for elements or features of the optical imaging device 1200 which are similar to those of the optical imaging device 100 shown in FIGS. 2A through 2C and are not substantially affected by the described differences from the optical imaging device 100 will be abbreviated hereinafter.

In the embodiment where the matrix of the optical imaging device 1200 is rectangular as shown in FIG. 10A, 10C and 10D, each of the groups 250A includes four detecting units 250 and one opening 231 common to the four detecting units 250. In other embodiments where the optical imaging device 1200 has other shape, the quantity of the detecting units 250 in each of the groups 250A may be different from four. In some embodiments, each of the groups 250A includes a first optoelectronic element 201 of a first of the four detecting units 250, a second optoelectronic element 202 of a second of the four detecting units 250, a third optoelectronic element 203 of a third of the four detecting units 250, and a fourth optoelectronic element 204 of a fourth of the four detecting units 250. In the embodiment of the group 250A shown in FIGS. 10C and 10D, the first to fourth optoelectronic elements 201-204 thereof are more proximate to the common opening 231 than other optoelectronic elements. In this embodiment, in each of the groups

250A, the four detecting units 250 arranged in a 2×2 array, and the common opening 231 is disposed over the center of the array. In some embodiments, the four detecting units 250 of the group 250A as shown in FIGS. 10C and 10D are more proximate to the common opening 231 as shown in FIGS. 10C and 10D than other detecting units 250 of the optical imaging device 1200 (shown in FIG. 10A) which are not shown in FIGS. 10C and 10D. In the illustrated embodiment, the common opening 231 overlap the four detecting units 250 sorted in the same group 250A.

In the exemplary group 250A as shown in FIGS. 10C through 10F, the four detecting units 250 and the common opening 231 are configured to form a first optical channel 261 extending along a path from the micro-lens 240A of the fourth of the four detecting units 250 to the first optoelectronic element 201 of the first of the four detecting units 250 through the common opening 231 to introduce light 80 incident to the optical imaging device 1200 (shown in FIG. 10A) along the same path, a second optical channel 262 extending along a path from the micro-lens 240A of the third of the four detecting units 250 to the second optoelectronic element 202 of the second of the four detecting units 250 through the common opening 231 to introduce the light 80 along the same path, a third optical channel 263 extending along a path from the micro-lens 240A of the second of the four detecting units 250 to the third optoelectronic element 203 of the third of the four detecting units 250 through the common opening 231 to introduce the light 80 along the same path, and a fourth optical channel 264 extending along a path from the micro-lens 240A of the first of the four detecting units 250 to the fourth optoelectronic element 204 of the fourth of the four detecting units 250 through the common opening 231 to introduce the light 80 along the same path. In some embodiments, although not shown in FIGS. 10C through 10F for clarity, regarding the detecting unit 250 including the first optoelectronic element 201 acting as an end of the first optical channel 261 as shown in FIGS. 10C and 10F, for example, this detecting unit 250 may also be sorted to belong to other groups 250A, and the second to fourth optoelectronic elements 202-204 of such detecting unit 250 may also be sorted to respectively belong to different other groups 250A and be acted as ends of the second to fourth optical channels 262-264 of those different other groups 250A.

Figure 10G:
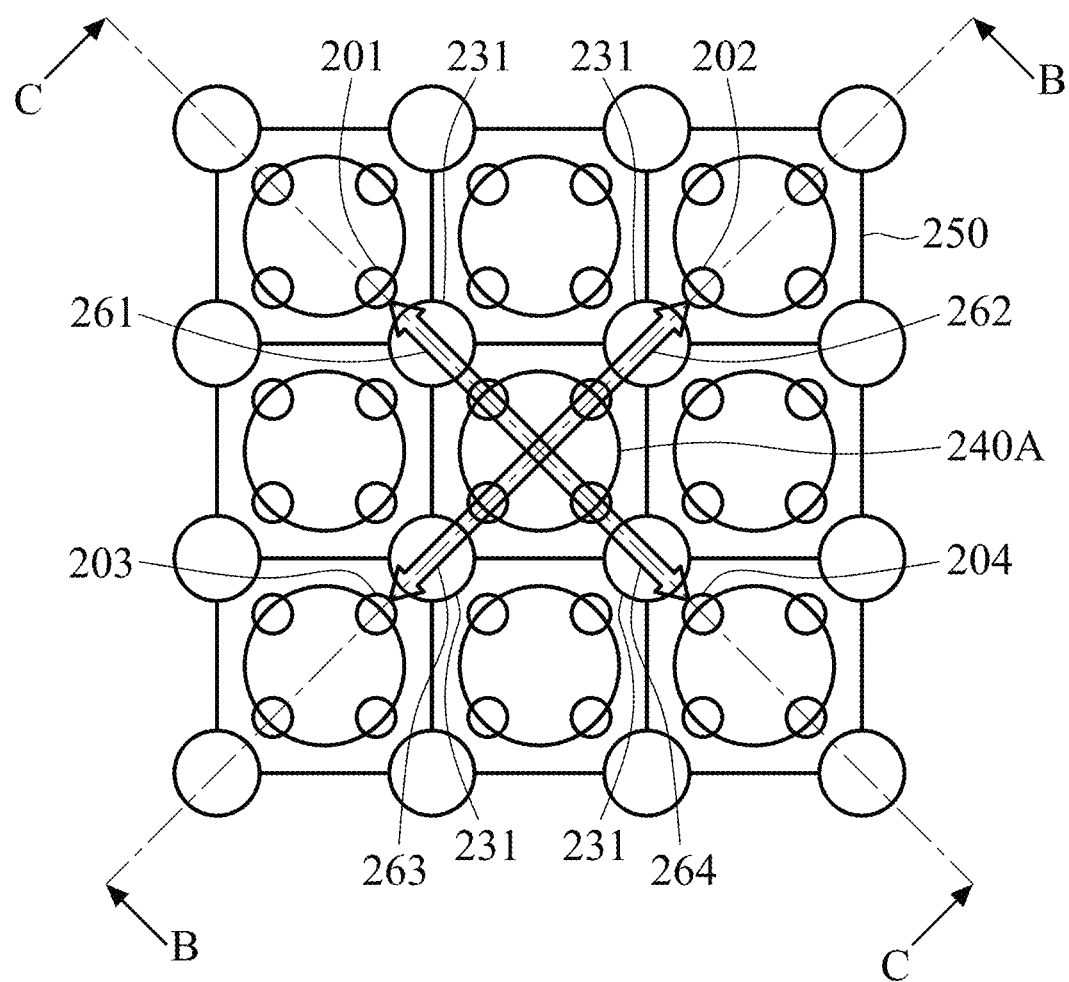
FIG. 10G shows a top view of parts of the optical imaging device shown in FIG. 10A.
Figure 10H:
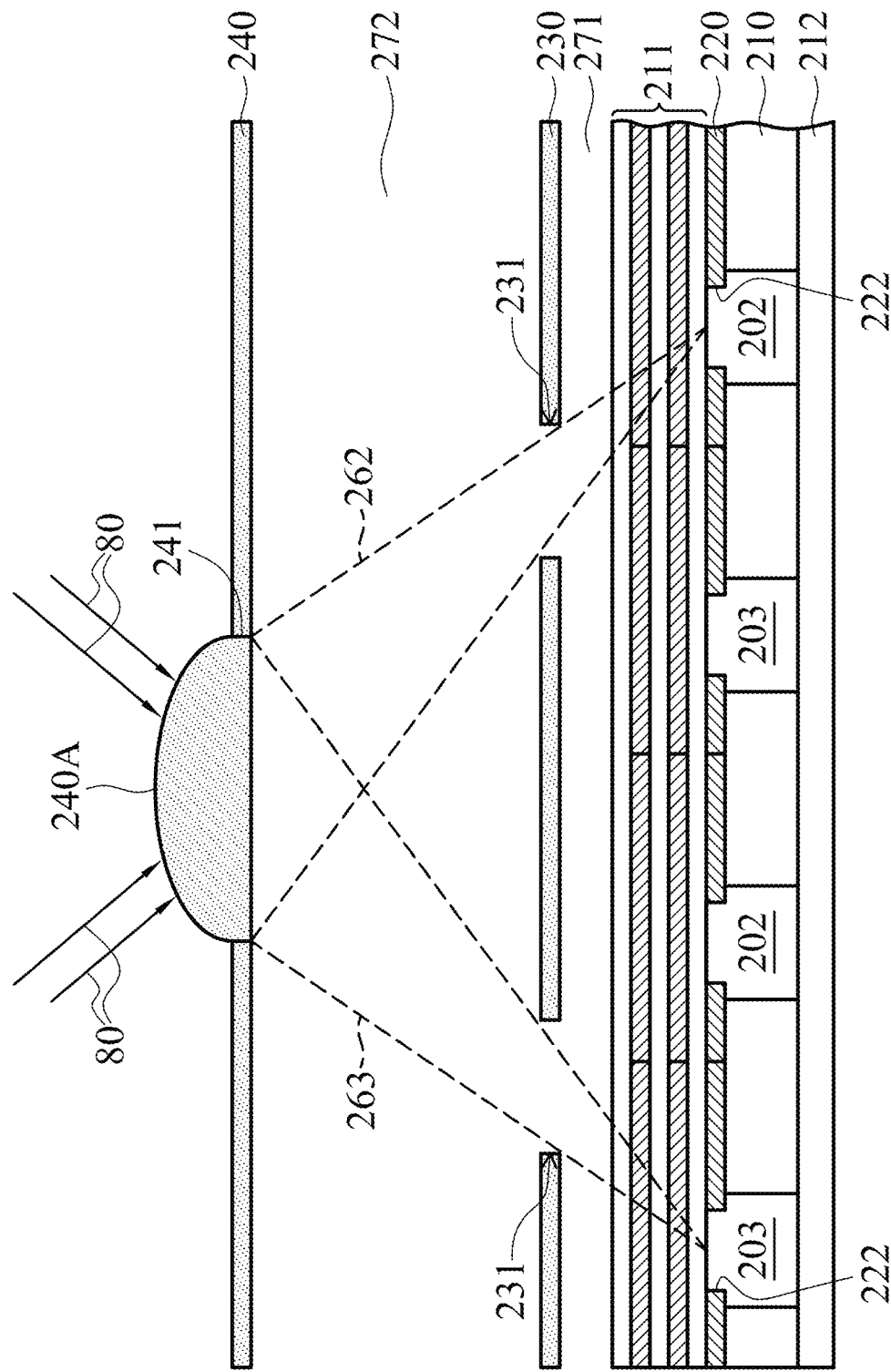
FIG. 10H shows a cross-sectional view along line B-B of FIG. 10G.
Figure 10I:
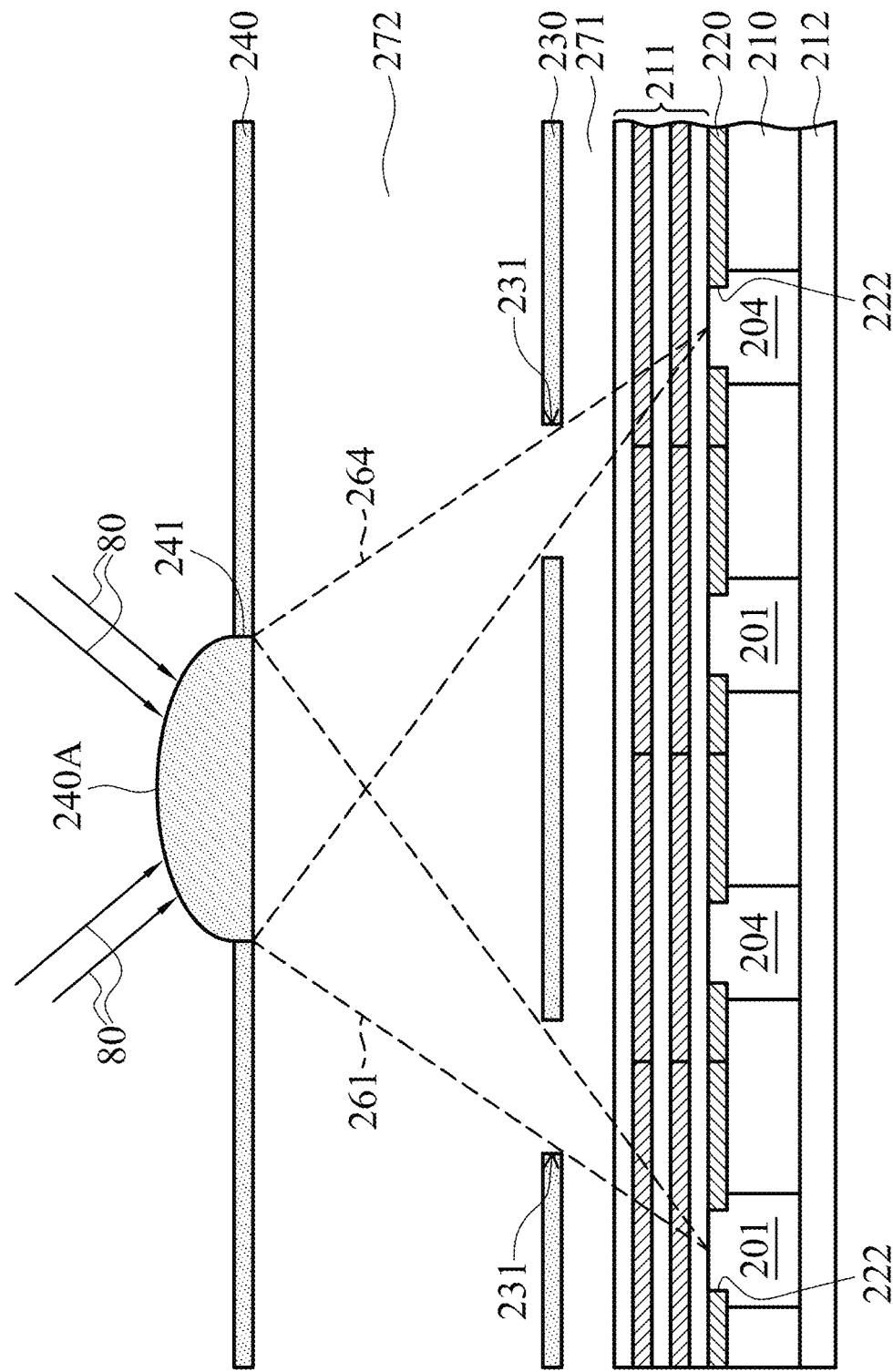
FIG. 10I shows a cross-sectional view along line C-C of FIG. 10G.

The detecting units 250 may comprise a plurality of groups, such as groups 250B as shown in FIGS. 10G through 10I according to an aspect of common micro-lenses 240A. FIG. 10G shows a top view of one exemplary group 250B of the optical imaging device 1200 shown in FIG. 10A, and FIGS. 10H and 10I show cross-sectional views along the respective line B-B and line C-C of FIG. 10G.

In the embodiment where the matrix of the optical imaging device 1200 is rectangular as shown in FIGS. 10A and 10G, each of the groups 250B includes five detecting units 250, and the micro-lens 240A of one of the five detecting units 250 is configured to be common to other four of the five detecting units 250. The light 80 (as shown in FIGS. 10I and 10H) is introduced from the common micro-lens 240A to respective one of the optoelectronic elements of each of the four other detecting units 250 through four respective openings 231. In other embodiments where the optical imaging device 1200 has other shape, the quantity of the detecting units 250 in each of the groups 250B may be different from five.

In some embodiments, each of the groups 250B includes a first optoelectronic element 201 of a first of the four other detecting units 250, a second optoelectronic element 202 of a second of the four other detecting units 250, a third optoelectronic element 203 of a third of the four other detecting units 250, and a fourth optoelectronic element 204 of a fourth of the four other detecting units 250. In the embodiment shown in FIG. 10G, nine detecting units 250 arranged in a 3×3 array are shown, and the group 250B includes the central detecting unit 250 and four corner detecting units 250 of the 3×3 array. In this embodiment, the micro-lens 240A of the central detecting unit 250 is common to introduce light to the optoelectronic element of the four corner detecting units 250. In some embodiments, the closest optoelectronic element to the central detecting unit 250 of each of the four corner detecting units 250 is designed to receive light from the micro-lens 240A of the central detecting unit 250, and may be replaced by one of the other optoelectronic elements of the same corner detecting unit 250 in an alternative embodiment. In some embodiments, the openings 231 respectively overlap the central detecting unit 250 and different one of the corner detecting units 250. In embodiment shown in FIG. 10G, the openings 231 are respectively disposed over the opposite corners of the central detecting unit 250 and the respective corner detecting units 250.

In the exemplary group 250B as shown in FIGS. 10G through 10I, the five detecting units 250 and the four opening 231 are configured to form a first optical channel 261 extending along a path from the common micro-lens (240A) to the first optoelectronic element 201 of a first of the four corner detecting units 250 through a first of the four openings 231 to introduce the light 80 along the same path, a second optical channel 262 extending along a path from the common micro-lens 240A to the second optoelectronic element 202 of a second of the four corner detecting units 250 through a second of the four openings 231 to introduce the light 80 along the same path, a third optical channel 263 extending along a path from the common micro-lens 240A to the third optoelectronic element 203 of a third of the four corner detecting units 250 through a third of the four openings 231 to introduce the light 80 along the same path, and a fourth optical channel 264 extending along a path from the common micro-lens 240A to the fourth optoelectronic element 204 of a fourth of the four corner detecting units 250 through a fourth of the four openings 231 to introduce the light 80 along the same path.

In some embodiments, although not shown in FIGS. 10G through 10I for clarity, the central detecting unit 250 may also be sorted to belong to some other groups 250B as one of the four corner detecting units 250 thereof, the four corner detecting units 250 may also be sorted to belong to some other groups 250B also as one of the four corner detecting units 250 thereof and may also be sorted to belong to another group 250B as the central detecting unit 250 thereof, and the four detecting units 250 rather than those sorted as the exemplary group 250B may also be sorted to belong to some other groups 250B as one of the four corner detecting units 250 thereof and may also be sorted to belong to another group 250B as the central detecting unit 250 thereof.

The groups 250A such as the embodiment shown in FIGS. 10C through 10F and the groups 250B such as the embodiment shown in FIGS. 10G through 10I may be sorted independently from each other, such that each of the detecting units 250 of the optical imaging device 1200 shown in FIG. 10A may be sorted in some of the groups 250A and also sorted in some of the groups 250B. As shown in FIG. 10G, the nine detecting units 250 of the 3×3 array may also be sorted to provide four 2×2 arrays of the detecting units 250, and the four 2×2 arrays may also be sorted as the groups 250A such as the exemplary group 250A as shown in FIGS. 10C through 10F. Similarly, the four detecting units 250 of the exemplary group 250A as shown in FIGS. 10C through 10F may also be sorted to belong to some groups 250B as shown in FIGS. 10G through 10I as one of the four corner detecting units 250 thereof and may also be sorted to belong to another group 250B as the central detecting unit 250 thereof.

In the embodiments shown in FIGS. 10B through 10I, four optoelectronic elements of each detecting units 250 are not covered by the opaque layer 220 and are active to receive light 80 from the corresponding micro-lenses 240A. In some embodiment, no micro-lens is configured to form optical channels connecting to some of the optoelectronic elements of one or some predetermined detecting units 250, and such optoelectronic elements are acted as dummy optoelectronic elements substantially disabled to receive light. In some embodiments, the dummy optoelectronic elements are completely covered by the opaque layer 220 and invisible in the top view to prevent noise input resulted from unwanted illumination.

In the embodiment shown in the top view, FIG. 10A, merely one or two optoelectronic elements of the periphery detecting units 255 are shown, while the first to fourth optoelectronic elements 201-204 of the inner detecting units 259 are shown and active to receive light from the corresponding micro-lenses 240A. In the corner detecting unit 251, merely the first optoelectronic element 201 thereof is active to receive light from the corresponding micro-lens 240A, while the second to fourth optoelectronic elements 202-204 are dummy, completely covered by the opaque layer (such as the opaque layer 220 shown in FIG. 10F) and invisible in FIG. 10A. In some embodiment, the cross-sectional view showing anyone of the second to fourth optoelectronic elements 202-204 of the corner detecting unit 251 is equivalent to FIG. 6B, for example, showing the optoelectronic element 4 is completely covered by the opaque layer 20. Similarly, in the corner detecting unit 252, merely the second optoelectronic element 202 thereof is active to receive light, while the first, third and fourth optoelectronic elements 201, 203 and 204 are disable to receive light. Similarly, in the corner detecting unit 253, merely the third optoelectronic element 203 thereof is active to receive light, while the first, second and fourth optoelectronic elements 201, 202 and 204 are disable to receive light. Similarly, in the corner detecting unit 254, merely the fourth optoelectronic element 204 thereof is active to receive light, while the first to third optoelectronic elements 201-203 are disable to receive light. Similarly, in the edge detecting units 256x, merely the first and second optoelectronic elements 201 and 202 thereof are active to receive light, while the third and fourth optoelectronic elements 203 and 204 are disable to receive light. Similarly, in the edge detecting units 256y, merely the first and third optoelectronic elements 201 and 203 thereof are active to receive light, while the second and fourth optoelectronic elements 202 and 204 are disable to receive light. Similarly, in the edge detecting units 257x, merely the third and fourth optoelectronic elements 203 and 204 thereof are active to receive light, while the first and second optoelectronic elements 201 and 202 are disable to receive light. Similarly, in the edge detecting units 257y, merely the second and fourth optoelectronic elements 202 and 204 thereof are active to receive light, while the first and third optoelectronic elements 201 and 203 are disable to receive light.

As mentioned above, in the present disclosure, an optical imaging device is provided. With the optoelectronic elements receiving inclined incident light, the optical imaging device can provide enlarged FOV. Therefore, the dimension of a chip where the optical imaging device is disposed can be decreased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical imaging device comprising a first detecting unit and a second detecting unit, and further comprising a third detecting unit in an edge portion of the optical imaging device, wherein the first detecting unit comprises:
    a plurality of first pixels respectively having a plurality of first optoelectronic elements;
    a first opaque layer having at least one opening over the plurality of first optoelectronic elements; and
    at least one first micro-lens over the first opaque layer, wherein the at least one first micro-lens overlaps at least one of the plurality of first pixels;
wherein the second detecting unit comprises:
    a plurality of second pixels respectively having a plurality of second optoelectronic elements;
    the first opaque layer having the at least one opening over the plurality of second optoelectronic elements; and
    at least one second micro-lens over the first opaque layer; wherein the at least one second micro-lens overlaps at least one of the plurality of second pixels, wherein
    the at least one opening overlaps at least one of the first pixels and at least one of the second pixels; and
wherein the third detecting unit comprises:
    a plurality of third pixels respectively having a plurality of third optoelectronic elements;
    the first opaque layer having at least one third opening over the plurality of third optoelectronic elements; and
    at least one third micro-lens over the first opaque layer, wherein the at least one third micro-lens overlaps at least one of the plurality of third pixels, wherein
    at least one of the plurality of third optoelectronic elements is covered by a second opaque layer and is shielded from light.

2. The optical imaging device as claimed in claim 1, wherein the first detecting unit and the second detecting unit are configured to transmit light from the at least one first micro-lens to one of the plurality of second optoelectronic elements through the at least one opening.

3. The optical imaging device as claimed in claim 2, wherein the light is incident to the one of the plurality of second optoelectronic elements with an incident angle in a range from greater than zero degree to 40 degrees.

4. The optical imaging device as claimed in claim 1, further comprising a multi-layered optical filter between the plurality of first optoelectronic elements and the first opaque layer.

5. The optical imaging device as claimed in claim 4, further comprising a transparent layer between the multi-layered optical filter and the first opaque layer.

6. The optical imaging device as claimed in claim 1, further comprising a substrate comprising a frontside and a backside, wherein the plurality of first optoelectronic elements are embedded in the backside of the substrate.

7. The optical imaging device as claimed in claim 6, further comprising an interconnect structure over the frontside the substrate, wherein the interconnect structure is electrically connected to the plurality of first optoelectronic elements.

8. The optical imaging device as claimed in claim 1, further comprising a transparent layer between the first opaque layer and the least one first micro-lens.

9. An optical imaging device comprising a substrate, an opaque-layer stack, a plurality of inner detecting units and a plurality of periphery detecting units,
wherein the opaque-layer stack comprises a first opaque layer over the substrate, a second opaque layer over the first opaque layer and a third opaque layer over the second opaque layer,
wherein the plurality of inner detecting units is arranged in a matrix when observed from a top view of a stack of the substrate and the opaque-layer stack,
wherein the plurality of periphery detecting units surrounds the matrix when observed from the top view,
wherein each of the inner and periphery detecting units comprises:
a first optoelectronic element, a second optoelectronic element, a third optoelectronic element and a fourth optoelectronic element, which are disposed in the substrate and spaced apart from each other, and wherein the fourth optoelectronic element is further away from the center of the matrix when observed from the top view than the first optoelectronic element;
at least one first opening in the first opaque layer, exposing at least the first optoelectronic element;
at least one second opening in the second opaque layer; and
one third opening embedded with a micro-lens in the third opaque layer,
wherein each of the inner detecting units comprises:
four first openings in the first opaque layer, respectively exposing the first to fourth optoelectronic elements, and
four second openings, spaced apart from each other, in the second opaque layer,
wherein each of the inner detecting units is configured to form a first optical channel extending from the micro-lens to the first optoelectronic element through the first of the second openings, a second optical channel extending from the micro-lens to the second optoelectronic element through the second of the second openings, a third optical channel extending from the micro-lens to the third optoelectronic element through the third of the second openings and a fourth optical channel extending from the micro-lens to the fourth optoelectronic element through the fourth of the second openings,
wherein each of the periphery detecting units is different from each of the inner detecting units in that the first opaque layer and the second opaque layer in each of the periphery detecting units are not opened as those in each of the inner detecting units.

10. The optical imaging device as claimed in claim 9, wherein the periphery detecting units are configured to receive light transmitting in inward direction to the combined range of the periphery detecting units and the inner detecting units to further enlarge the field of view (FOV) of the optical imaging device.

11. The optical imaging device as claimed in claim 9, wherein the first opaque layer in each of the periphery detecting units comprises one opening exposing the first optoelectronic element but covering the fourth optoelectronic element,
so that the fourth optoelectronic element in each of the periphery detecting units, which is covered by the first opaque layer, is considered as a dummy optoelectronic element and a pixel having the covered fourth optoelectronic element is considered as a dummy pixel.

12. The optical imaging device as claimed in claim 9, wherein the optoelectronic elements, the at least one first opening, the at least one second opening, the at least one third opening and the at least one micro-lens are configured to transmit light to the optoelectronic elements.

13. The optical imaging device as claimed in claim 9, further comprising a second detecting unit comprising at least one of:
a plurality of second pixels having a plurality of second optoelectronic elements;
an opaque layer having at least one opening over the plurality of second optoelectronic elements; and
at least one second micro-lens over the opaque layer; wherein the at least one second micro-lens overlaps at least one of the plurality of second pixels.

14. The optical imaging device as claimed in claim 13, wherein the at least one opening overlaps at least one of the pixels and at least one of the second pixels.

15. The optical imaging device as claimed in claim 13, wherein the second detecting unit is configured to transmit light from the at least one second micro-lens to one of the plurality of second optoelectronic elements through the at least one opening.

16. The optical imaging device as claimed in claim 9, further comprising a third detecting unit in an edge portion of the optical imaging device.

17. The optical imaging device as claimed in claim 16, wherein the third detecting unit comprises:
a plurality of third pixels having a plurality of third optoelectronic elements;
an upper opaque layer having at least one opening over the plurality of third optoelectronic elements; and
at least one further micro-lens over the upper opaque layer.

18. The optical imaging device as claimed in claim 17, wherein the at least one further micro-lens overlaps at least one of the plurality of third pixels, at least one of the plurality of third optoelectronic elements is covered by a lower opaque layer.

19. The optical imaging device as claimed in claim 9, further comprising at least one of:
a multi-layered optical filter between the optoelectronic elements and the opaque layer; and
a transparent layer between the multi-layered optical filter and the opaque layer;
a substrate comprising a frontside and a backside, wherein the optoelectronic elements are embedded in the backside of the substrate; and
an interconnect structure over the frontside the substrate, wherein the interconnect structure is electrically connected to the optoelectronic elements.

20. The optical imaging device as claimed in claim 9, further comprising a transparent layer between the opaque layer and at least one first micro-lens.

* * * * *